United States Patent
Peng et al.

(10) Patent No.: US 12,092,963 B2
(45) Date of Patent: Sep. 17, 2024

(54) METHOD OF DETERMINING CHARACTERISTIC OF PATTERNING PROCESS BASED ON DEFECT FOR REDUCING HOTSPOT

(71) Applicant: ASML NETHERLANDS B.V., Veldhoven (NL)

(72) Inventors: Xingyue Peng, San Jose, CA (US); Duan-Fu Stephen Hsu, Fremont, CA (US); Rafael C. Howell, Santa Clara, CA (US); Qinglin Li, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 530 days.

(21) Appl. No.: 17/605,358

(22) PCT Filed: Mar. 26, 2020

(86) PCT No.: PCT/EP2020/058479
§ 371 (c)(1),
(2) Date: Oct. 21, 2021

(87) PCT Pub. No.: WO2020/216572
PCT Pub. Date: Oct. 29, 2020

(65) Prior Publication Data
US 2022/0229374 A1    Jul. 21, 2022

(51) Int. Cl.
*G06F 30/30*    (2020.01)
*G03F 7/00*    (2006.01)

(52) U.S. Cl.
CPC .......... *G03F 7/70616* (2013.01); *G03F 7/705* (2013.01)

(58) Field of Classification Search
CPC ......... G03F 7/70616; G03F 7/705; G03F 1/70
See application file for complete search history.

(56) References Cited

U.S. PATENT DOCUMENTS

| 5,229,872 A | 7/1993 | Mumola |
| 5,296,891 A | 3/1994 | Vogt et al. |
| (Continued) | | |

FOREIGN PATENT DOCUMENTS

| CN | 109891319 | 6/2019 |
| KR | 10-2015-0125691 | 11/2015 |
| (Continued) | | |

OTHER PUBLICATIONS

International Search Report and Written Opinion issued in corresponding PCT Patent Application No. PCT/EP2020/058479, dated Jul. 10, 2020.

(Continued)

*Primary Examiner* — Jack Chiang
*Assistant Examiner* — Brandon Bowers
(74) *Attorney, Agent, or Firm* — Pillsbury Winthrop Shaw Pittman LLP

(57) ABSTRACT

Methods for optimizing an aspect of a patterning process based on defects. For example, a method of source and mask optimization of a patterning process includes obtaining a location on a substrate having a threshold probability of having a defect; defining an defect ambit around the location to include a portion of a pattern on the substrate and one or more evaluation points associated with the portion of the pattern; determining a value of a first cost function based on a defect metric associated with the defect; determining a first guide function for the first cost function, wherein the first guide function is associated with a performance metric of the patterning process at the one or more evaluation locations within the defect ambit; and adjusting a source and/or a mask characteristic based on the value of the first cost function, and the first guide function.

20 Claims, 22 Drawing Sheets

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 6,046,792 | A | 4/2000 | Van Der Werf et al. |
| 7,171,038 | B2 * | 1/2007 | Adler .................. G03F 7/7065 250/307 |
| 7,587,704 | B2 | 9/2009 | Ye et al. |
| 9,057,965 | B2 * | 6/2015 | Hsieh .................. G06F 30/398 |
| 10,558,124 | B2 | 2/2020 | Liu et al. |
| 11,403,564 | B2 * | 8/2022 | Chiang ................ G06N 20/10 |
| 11,681,849 | B2 | 6/2023 | Hsu et al. |
| 2005/0076322 | A1 | 4/2005 | Ye et al. |
| 2009/0157360 | A1 | 6/2009 | Ye et al. |
| 2010/0315614 | A1 | 12/2010 | Hansen |
| 2013/0179847 | A1 | 7/2013 | Hansen |
| 2013/0326437 | A1 | 12/2013 | Liu et al. |
| 2014/0072903 | A1 | 3/2014 | Satake et al. |
| 2015/0378262 | A1 | 12/2015 | Liu et al. |
| 2019/0102507 | A1 | 4/2019 | Tan et al. |

FOREIGN PATENT DOCUMENTS

| | | |
|---|---|---|
| WO | 2010059954 | 5/2010 |
| WO | 2018077787 | 5/2018 |
| WO | 2019162346 | 8/2019 |

OTHER PUBLICATIONS

Taiwanese Office Action issued in corresponding Taiwanese Patent Application No. 109112474, dated Feb. 25, 2021.

Research Disclosure, "Enhanced lithographic throughput by improved source and mask optimization flow", vol. 631, No. 30 (2016).

Polprasert J. et al.: "Optimal Reactive Power Dispatch Using Improved Pseudo-Gradient Search Particle Swarm Optimization", Electric Power Components and Systems, 44:5, pp. 518-532 (2016).

Spence, C.: "Full-Chip Lithography Simulation and Design Analysis—How OPC Is Changing IC Design", Proc. of SPIE, vol. 5751, pp. 1-14 (2005).

Cao, Y. et al.: "Optimized Hardware and Software For Fast, Full Chip Simulation", Proc. of SPIE, vol. 5754 (2005).

Rosenbluth, A.E. et al.: "Optimum Mask and Source Patterns to Print A Given Shape", J. Micro/Nanolith. MEMS MOEMS 1(1), pp. 13-20 (2002).

Granik, Y.: "Source Optimization for Image Fidelity and Throughput", Journal of Microlithography, Microfabrication, Microsystems 3(4), pp. 509-522 (Oct. 2004).

Socha, R. et al.: "Simultaneous Source Mask Optimization (SMO)", Proc. of SPIE, vol. 5853 (2005).

Nocedal, J. et al.: "Numerical Optimization", Second Edition, Cambridge University Press, Springer (2006).

* cited by examiner

METHOD OF DETERMINING CHARACTERISTIC OF PATTERNING PROCESS BASED ON DEFECT FOR REDUCING HOTSPOT

CROSS-REFERENCE TO RELATED APPLICATIONS

This application is the U.S. national phase entry of PCT Patent Application No. PCT/EP2020/058479 which was filed on Mar. 26, 2020, which claims the benefit of priority of U.S. Patent Application No. 62/838,423 which was filed on Apr. 25, 2019 and which is incorporated herein in its entirety by reference.

TECHNICAL FIELD

The description herein relates to lithographic apparatuses and processes, and more particularly to a tool to for optimization of one or more aspect(s) of a patterning process such as a mask optimization and a source optimization for use in a lithographic apparatus or process.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet (DUV) or extreme-ultraviolet (EUV) illumination source, creating individual functional elements having dimensions well below 100 nm, i.e. less than half the wavelength of the radiation from the illumination source (e.g., a 193 nm DUV and 13.5 nm EUV illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where is the wavelength of radiation employed (currently in most cases 248 nm or 193 nm or 13.5 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

BRIEF SUMMARY

In an embodiment, there is provided a method of source and mask optimization of a patterning process. The method includes obtaining a location on a substrate having a threshold probability of having a defect; defining an defect ambit around the location to include a portion of a pattern on the substrate and one or more evaluation points associated with the portion of the pattern; determining a value of a first cost function based on a defect metric associated with the defect; determining a first guide function for the first cost function, wherein the first guide function is associated with a performance metric of the patterning process at the one or more evaluation locations within the defect ambit; and adjusting a source and/or a mask characteristic by executing a source mask optimization process for a design layout using the value of the first cost function, and the first guide function.

Furthermore, in an embodiment, there is provided a method of determining a characteristic associated with a patterning process. The method includes obtaining a location on a substrate having a threshold probability of having a defect; defining an defect ambit around the location to include a portion of a pattern on the substrate and one or more evaluation points associated with the portion of the pattern; determining a first cost function based on a defect metric associated with the defect; determining a first guide function for the first cost function, wherein the first guide function is associated with a performance metric of the patterning process at the one or more evaluation locations within the defect ambit; and determining the characteristic associated with the patterning process by simulating a process of the patterning process using the first cost function, and the first guide function.

Furthermore, in an embodiment, there is provided a method of source and/or mask optimization of a patterning process. The method includes obtaining a pattern on a substrate; determining whether a defect exists in the pattern on the substrate; responsive to existing of the defect, determining a value of a first cost function associated with the defect; and adjusting a source and/or a mask characteristic by executing a source mask optimization process for a design layout using the value of the first cost function, and a second cost function such that a sum of the first and the second cost functions is reduced.

Furthermore, in an embodiment, there is provided a computer program product comprising a non-transitory computer readable medium having instructions recorded thereon, the instructions when executed by a computer system implementing the aforementioned method.

BRIEF DESCRIPTION OF THE DRAWINGS

Embodiments will now be described, by way of example only, with reference to the accompanying drawings in which.

Figure 1:
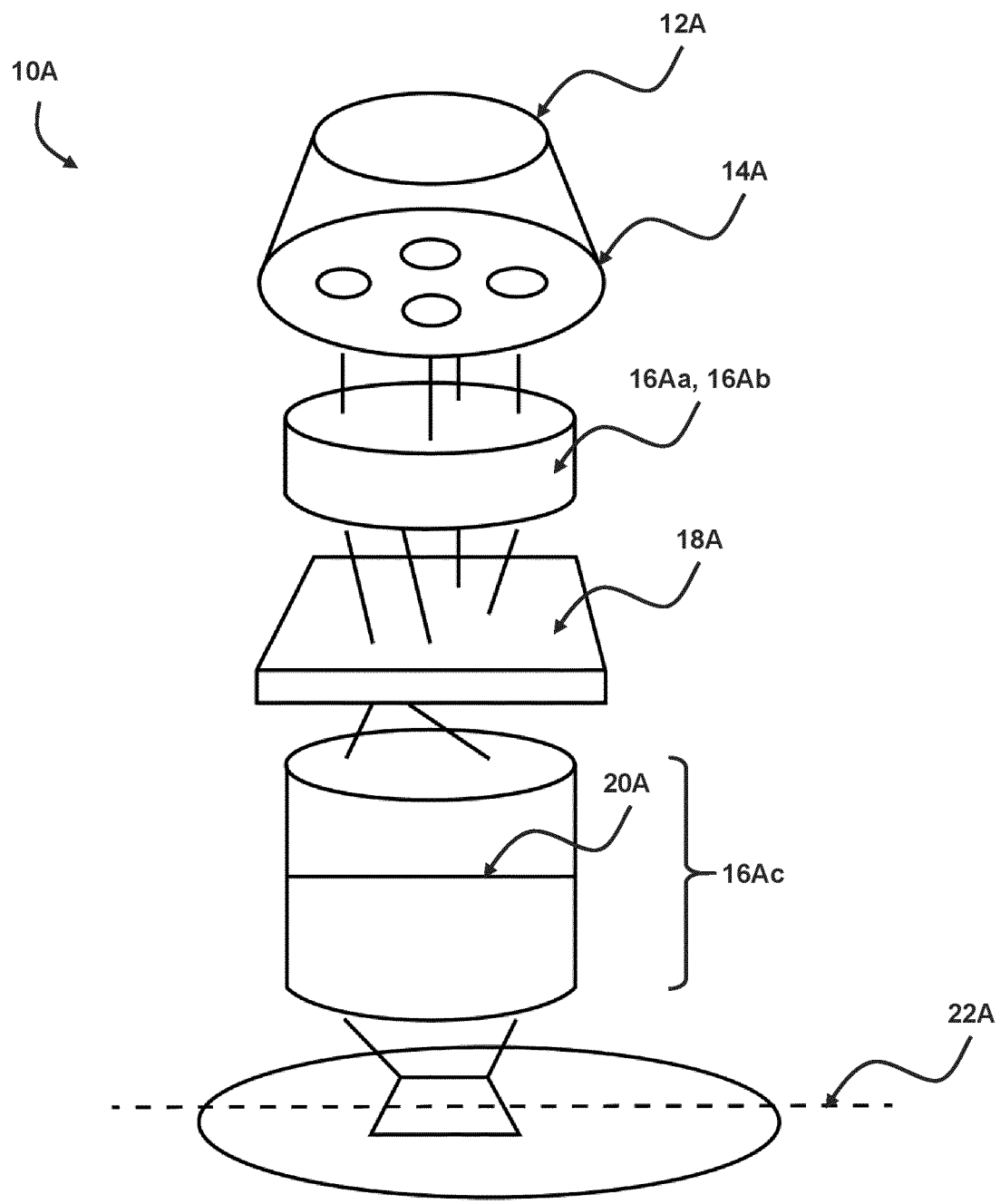
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta_{max}$) where n is the index of reflection of the media between the last lens element to the substrate.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate.

The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
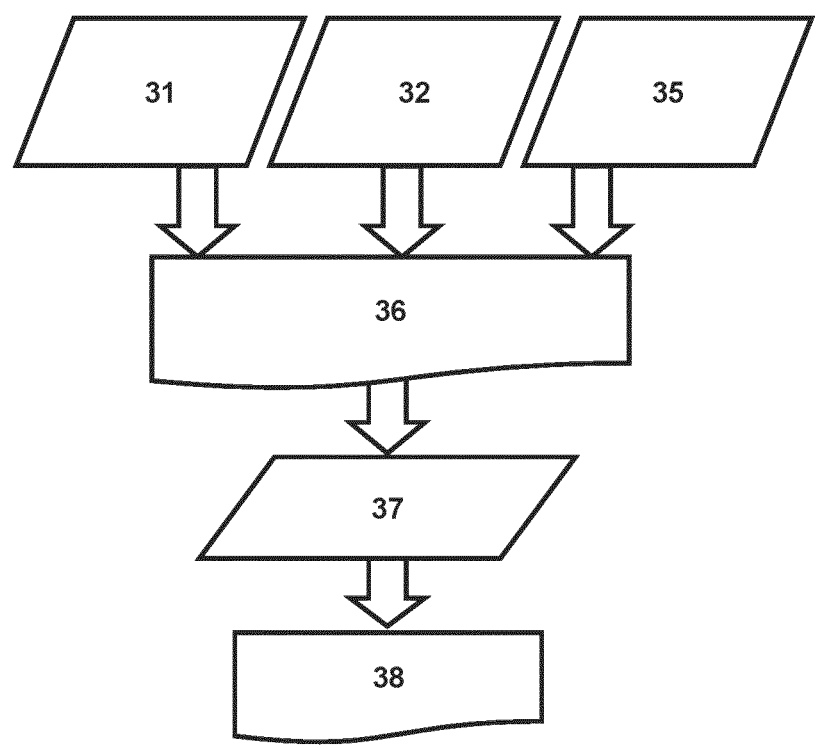
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma ($\sigma$) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In the present disclosure, an optimization process (e.g., source mask optimization (SMO) discussed in FIGS. 12-15) relates to one or more of a patterning process that employ process models (e.g., an optics model, a mask model, a resist model etc. in FIG. 2). The optimization process involves execution of the one or more process models and computation of a cost function which is reduced by modifying one or more characteristic (e.g., source, mask pattern, etc.) of the patterning process. In an embodiment, the one or more characteristics may be described by design variables. Hence, an optimized characteristic may also be referred as an optimized design variable, where a design variable (e.g., z) is optimized based on a cost function (e.g., CF).

In an embodiment, the modifying of the characteristic is based on a gradient of the cost function that guides how the characteristic should be modified to reduce the cost function. In an embodiment, such cost function is a function of certain continuous metric such as an edge placement error (e.g., a difference between contours of printed pattern and a target pattern). Using continuous metric or cost function of continuous nature allows use of gradient-based optimizing algorithms that have acceptable runtime performance of an optimization process.

In an embodiment, non-smooth or discontinuous cost functions (e.g., based on defect counts) are not employed, as such non-smooth cost function necessitates use of non-continuous optimizers which have relatively high runtime compared to the continuous cost function based optimization. In addition, such optimizers may not provide best solutions. In some embodiments, use of non-smooth cost function such as related to defects may be desired so that optimization may be performed to reduce a particular defect or several defects that may potentially be appear on a printed substrate.

The present disclosure provides methods to bridge the gap in optimization process so that non-smooth cost function may be employed, for example, to reduce the number of defects and thereby improve yield of the patterning process. It can be understood by a person skilled in the art that concepts of a guide function (e.g., a pseudo-gradient) and discrete cost function (e.g., a first cost function discussed herein) may be applied to any aspect of the patterning process comprising an optimization process and not limited to a particular aspect of the patterning process. In an embodiment, the concepts are explained with respect to a source mask optimization process for better understandability.

Figure 3:
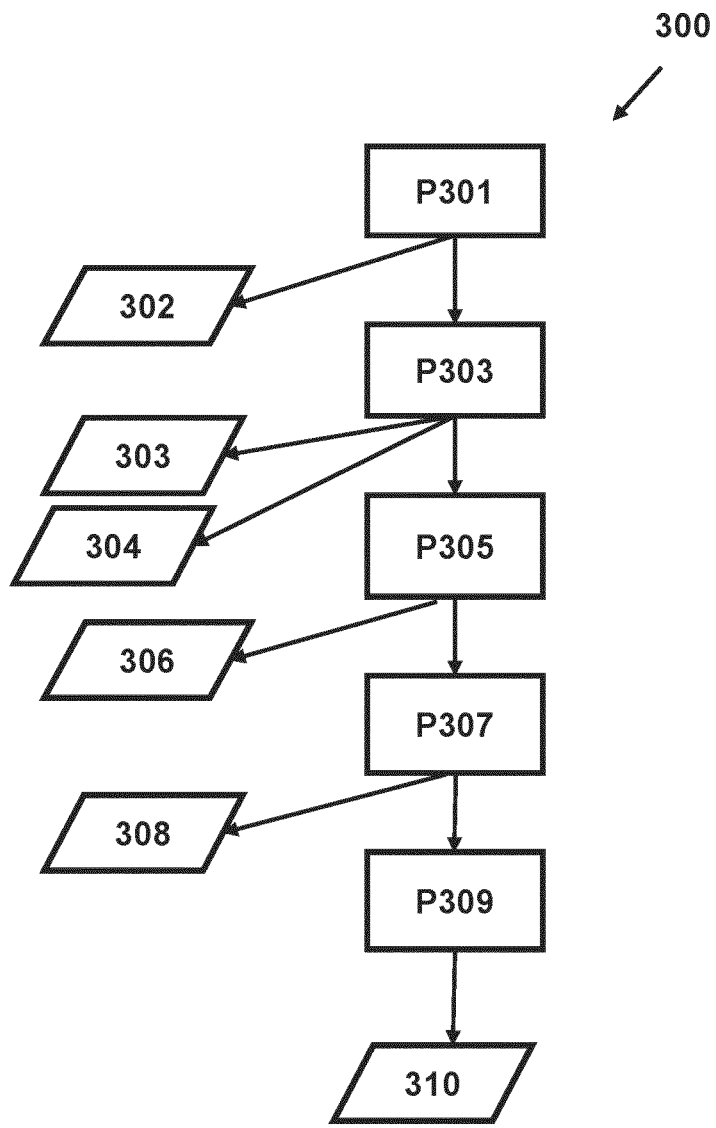
FIG. 3 is a flow chart of a method of source and/or mask optimization of a patterning process, according to an embodiment.

FIG. 3 is a flow chart of a method 300 of source and/or mask optimization of a patterning process. The method involves optimizing a characteristic of a source and/or mask to improve a performance metric of the patterning process by supplementing a guide function (e.g., a gradient) of a continuous cost function (e.g., associated with EPE) with a first guide function (e.g., a pseudo-gradient) associated with a discontinuous cost function (e.g., function of a defect, hotspot, etc.). The guide function (e.g., a first guide function or pseudo gradient) is any function that guides or provides a direction (e.g., increase or decrease by certain value) in which a characteristic being optimized should be modified so that an associated cost function is reduced or minimized (e.g., after several iterations). The method 300 improves the performance metric as well as reduce defect occurrence thereby improving e.g., yield of the patterning process.

In the following discussion a guide function is referred as a gradient or pseudo-gradient as an example guiding function and does not limit the scope of the present disclosure. In an embodiment, the guide function provides a defect related information and guides how the cost function should be modified based on the defect related information. For example, the defect related information may be an evaluation location around a defect, a metric associated with the evaluation location, or other relevant information that can be used for optimization of an aspect of the patterning process. In an embodiment, the guide function may not necessarily be a differential of a cost function used in the optimization process.

In an embodiment, the method 300 can be employed to optimize a source shape, and/or a mask pattern so that at least one of the performance metric such as a critical dimension of the pattern, or an edge placement error of a pattern that will be printed on the substrate. It can be understood by a person skilled in the art that the optimizing of the source and/or mask is used as an example to illustrate the use of pseudo-gradient and discontinuous function. However, the present disclosure is not limited to optimizing of the source and/or the mask, but can be used to optimize other aspects related to patterning process. For example, the defect based pseudo-gradient can be used to determine/optimize dose, focus, etc. of the lithographic apparatus. The steps of the method 300 are discussed further as follows.

Procedure P301 involves obtaining a location 302 (also referred as a hotspot location) on a substrate with the probability of having a defect equal to or greater than a threshold (e.g., greater than 0.6). For example, a hotspot location 302 is a location having a relatively high probability of defect occurrence compared to other locations on the substrate. For example, such location are associated with a relatively high feature density compared to a feature density at other location on the substrate. For example, with a probability value ranges between 0 and 1, a high probability may be a value between 0.5-1, or preferably greater than 0.8. In an embodiment, probability value 0 indicates no defect, and 1 indicates a defect occurrence. Typically, defects refer to a pattern that do not satisfy design specification. In an embodiment, a characteristic (e.g., CD, distance between features, etc.) of a pattern may be associated with a defect tolerance limit. If the characteristic is within the defect tolerance limit, then the pattern may be characterized as a defect. Hence, although a printed substrate may not have a real defect, there will be location associated with patterns that may potentially occur as a defect. In an embodiment, the hotspot location 302 is associated with one or more features of the pattern having critical dimension within a defect tolerance.

In an embodiment, the defect may be a bridging defect, a necking defect, or any other defects observed in a printed pattern on the substrate. The present disclosure is not limited by the type of defect associated with a pattern on a substrate. In an embodiment, the bridging defect may be characterized by a distance between two adjacent features, where the distance is associated with a defect tolerance. Thus, if at a particular location, the distance between features is close enough to be within the tolerance, then the location is a hotspot location 302.

In an embodiment, the hotspot location 302 may refer to locations having actual defects printed on the substrate. In other words the probability of defect is 1. In an embodiment, defects may be detected using a lithographic manufacturability check (LMC) performed on a simulated pattern on a substrate or actual printed pattern captured via a metrology tool (e.g., in SEM images) of a printed substrate. The LMC can are conditions associated with on a parameter of pattern that qualifies a pattern as a defective pattern or a potentially defective pattern (i.e., high probability of defect).

Procedure P303 involves defining a defect ambit 304 around the hotspot location 302 to include a portion of a pattern on the substrate and one or more evaluation locations 303 (also referred as evaluation points 303) associated with the portion of the pattern.

In an embodiment, the defect ambit 304 is a boundary around the portion of the pattern with the hotspot location 302 at the center of the boundary. In an embodiment, the defect ambit 304 includes one or more features associated with the hotspot location 302 and the one or more evaluation locations 303 (see EP1 and EP2 in FIG. 5A) are locations along a contour of the one or more features. In an embodiment, the boundary is a circular boundary, square boundary, or other geometrical shape. In an embodiment, the defect ambit 304 is based on an impact of features within a neighborhood of the hotspot location 302 on the pattern.

Figure 5A:
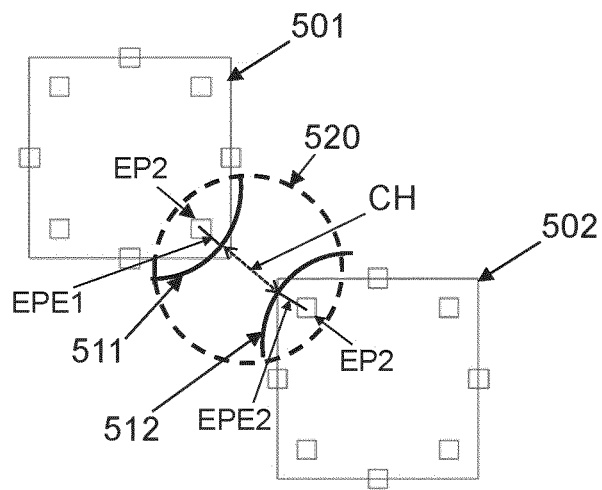
FIG. 5A illustrates a defect ambit defined around a defect in a portion of a pattern on the substrate, according to an embodiment.
Figure 6A:
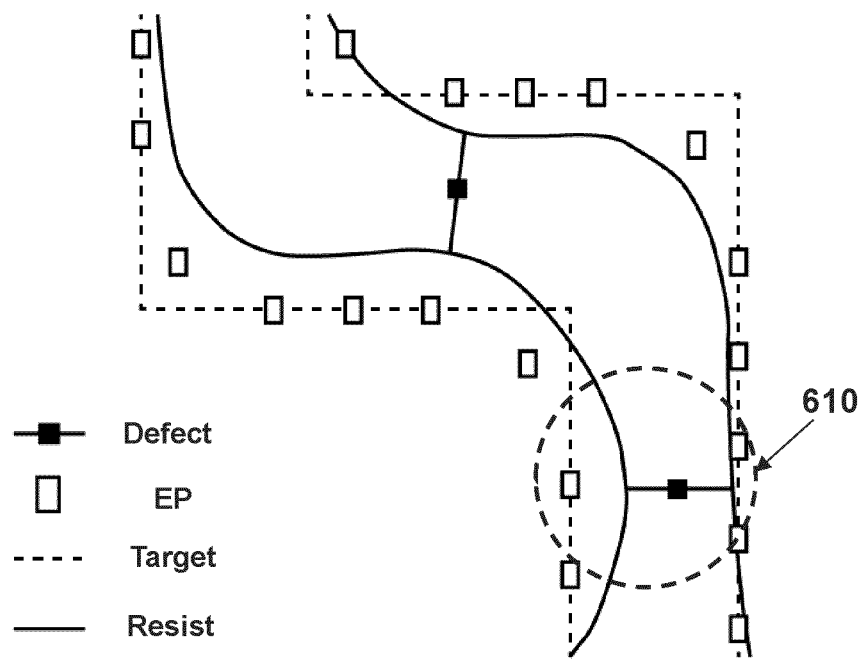
FIGS. 6A and 6B illustrate defect ambits defined around a bridging defect and a necking defect, respectively, according to an embodiment.
Figure 6B:
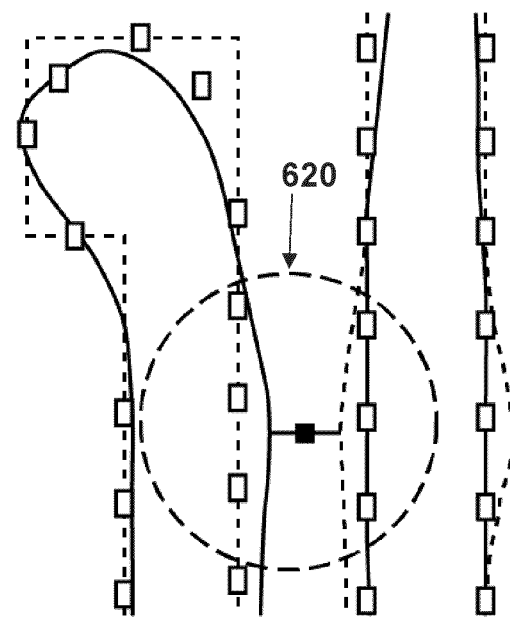

In an embodiment, example defect ambits (e.g., 520, 610, and 620) is illustrated in FIGS. 5A, 6A and 6B. The defect ambits are defined around, for example, a detected defect such as bridging (e.g., in 520 and 620) or necking (e.g., in 610). In an embodiment, the defects are characterized by, e.g., CD or EPE measure as a distance between two contours (e.g., of a printed pattern and a desired pattern) or between evaluation locations on a contour. In an embodiment, a defect may be detected using a defect detection method or an inspection method, where one or more defect detectors are defined based on a characteristic (e.g., CD) of pattern, as discussed earlier.

FIG. 5A illustrates a target pattern (i.e., a design pattern of the design layout) comprising two target features 501 and 502 (e.g., contact holes) and a portion of a pattern 511 and 512 on the substrate. Furthermore, evaluation locations or points (e.g., EP1 and EP2) are defined around the pattern on the substrate or the target pattern associated therewith. In an embodiment, a distance CH may be measured between two features 511 and 512. The distance CH is within a defect tolerance of a bridging defect, hence the pattern is said to have a bridging defect. The corresponding location (i.e., at the distance CH) on the substrate is classified as a hotspot location 302.

Figure 5B:
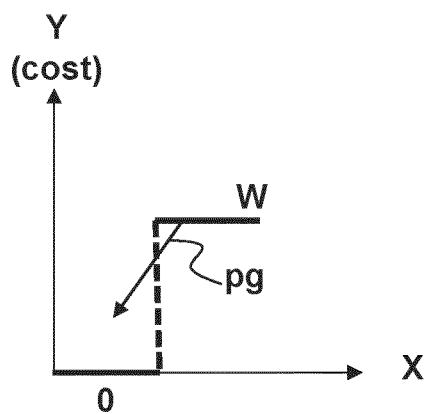
FIG. 5B illustrates an example cost function associated with a bridging defect employed in the method in FIG. 3, according to an embodiment.

Then, as mentioned in procedure P303, a defect ambit 520 is defined around the bridging defect, e.g., the bridging defect (e.g., CH) being at the center of the defect ambit 520. The evaluation points within the defect ambit are further modified via a characteristic (e.g., mask pattern, source, dose, etc.) of the patterning process. In an embodiment, the characteristic can be determined e.g., via simulation of a process model of the patterning process employing the first gradient (e.g., gradient pg in 5B) and the first cost function, as discussed herein and as illustrated in FIG. 5B. The determined characteristic is such that the first cost function (e.g., value W) is reduced (e.g., to zero) effectively reducing the second cost function (e.g., sum of EPEs at all evaluation points). The first gradient pg provides a direction in which such characteristic modification should be performed so that the first cost function is reduced.

Note that, the defect ambit 520 includes two evaluation points EP1 and EP2, indicating that a first guide function (e.g., a pseudo-gradient) should be assigned to a performance metric (e.g., EPE1 and EPE2) associated with such evaluation points EP1 and EP2. Thus, based on the defect ambit, the characteristic (e.g., a mask pattern of a mask, and/or a source, dose, focus, of the lithographic apparatus, etc.) associated with the patterning process is determined resulting in a reduced defect occurrence.

In an embodiment, a positive value is assigned via a first cost function at EP1 and EP2, in FIG. 5B. The first cost function indicates that when a defect exists (e.g., CD of a feature satisfies a defect threshold), the value of the first cost function increase from 0 to W. When such first cost function is used with a cost function (e.g., the second cost function) of the optimization process, a value of the cost function is increased, thereby the optimization process recognizes a defect occurrence. Further, the first guide function pg guides the optimization process to reduce the cost function by modifying contours at EP1 and EP2. In an embodiment, the first cost function may take any mathematical form defined based upon defects. For example, the first cost function can be a sum of printed defects on a substrate, a sum of potential defects (e.g., hotspots location), a probability value based function associated with a hotspot, or other appropriate mathematical form.

Similar to FIG. 5A, FIGS. 6A and 6B illustrate another examples of defects and associated defect ambits. FIG. 6A illustrate a necking defect and a defect ambit 610 defined around the necking defect. FIG. 6B is another example of the bridging defect and a defect ambit 620 defined around the bridging defect. In an embodiment, the first cost function(s) associated with the necking defect (and the bridging defect) may be used during the optimization process. Further, the first guide function associated with evaluation points EP within the defect ambit 610 and 620, respectively may be determined and used during the optimization process as discussed in procedures P305-P309 below.

Procedure P305 involves determining a value of a first cost function 306 based on a defect metric (e.g., number of defects, a difference between desired and measured CD value) associated with the defect. In an embodiment, the first cost function 306 is a sum of a number of hotspots and a number of defects printed on the substrate. In an embodiment, the first cost function 306 is defined as zero outside the defect ambit 304 and a penalty value (e.g., w) within the defect ambit 304. For example, as illustrated in FIG. 5B, the first cost function (e.g., CF1 below) is associated with a bridging defect is a non-continuous function can be expressed as follows:

$$CF1 = \begin{cases} 0, & \text{if no bridiging defect} \\ w, & \text{if bridging defect} \end{cases}$$

As such, during optimization (e.g., SMO), when the hotspot (e.g., bridging defect) is identified, a cost of value w may be added to the existing cost function, which is based on a continuous function.

Procedure P307 involves determining a first guide function 308 for the first cost function 306, where the first guide function 308 (e.g., pseudo-gradient) is associated with a performance metric of the patterning process at the one or more evaluation locations 303 within the defect ambit 304. In an embodiment, the determining of the first guide function 308 involves determining a gradient value of the performance metric at the one or more evaluation locations 303 within the defect ambit 304; and assigning a positive value to the first cost function at the one or more evaluation locations 303 within the defect ambit 304.

The gradient value of the first guide function 308 evaluated using of the performance metric (e.g., EPE) at each of the plurality of evaluation points with respect to the characteristic of the source and/or the mask to be optimized, where the gradient value provides a direction in which the characteristic should be modified so that the first cost function 306 is reduced.

An example of the first guide function is implemented in following gradient equation, where the $\widehat{epe}$ is associated with the defect.

$$\frac{\partial CF1}{\partial m} = w \sum_i \int \frac{\partial F}{\partial \widehat{epe}_i} \frac{\partial \widehat{epe}_i}{\partial R(x, y)} \frac{\partial R(x, y)}{\partial m} dxdy$$

In the above equation, CF1 refers to the first cost function 306 (e.g., CF1 discussed earlier), m is a mask characteristic, i are the evaluation locations within the defect ambit 304, $\widehat{epe}$ refers to edge placement error at i-th evaluation location within the defect ambit 304, and R(x, y) is the resist image that contains defective features (or potential defective features). In embodiment, such value will be zero when there is no defect. However, when a defect exists, the gradient $\partial CF1/\partial m$ is computed as above. In an embodiment, the value of the gradient is proportional to the first cost function value w. Hence, although the first cost function 306 is discontinuous or non-smooth, a guiding function (e.g., pseudo gradient) can be computed and further used in optimization process such as SMO (e.g., discussed with respect to FIG. 12-15).

Procedure P309 involves adjusting a source and/or a mask characteristic 310 by executing a source mask optimization process (e.g., discussed with respect to FIG. 12-15) for a design layout using the first cost function 306, and the first guide function 308. In an embodiment, such optimization process adjusts the characteristic of the source and/or the mask so that the performance metric and the defect metric associated with the patterning process is improved. In an embodiment, the optimizing the source and/or mask is an iterative process. In an embodiment, example optimizing process are discussed in FIGS. 12-15, where the optimizing methods can be modified to employ the first cost function 306 and the first guide function 308.

In an embodiment, an iteration of the adjusting of the characteristic 310 involves executing the source mask optimization process using the design layout to determine a current characteristic of the source and/or the mask, and the performance metric of the patterning process. In an embodiment, the source mask optimization process (e.g., in FIGS. 12-15) involves a model of the source, a mask model of the design layout, a model of the projection optics, or a combination thereof, where the models are configured to simulate an aerial image produced by the source, the portion of the design layout and the projection optics. After the optimization, optimized characteristics 310 are obtained that can be used in the lithographic apparatus during the patterning process.

In an embodiment, the optimizing of the source and/or the mask of the patterning process comprises executing at least one of the models. In an embodiment, determining the optimized source 310 involves optimizing an illumination shape and/or an illumination intensity.

Furthermore, the iteration involves evaluating a second cost function and a second gradient of the second cost function, where the second cost function is a function of the performance metric. In an embodiment, the evaluating of the second cost function comprises: computing values of the performance metric at a plurality of evaluation locations of the pattern on the substrate, where an evaluation location is a point on a contour of the pattern. For example, performance metric (e.g., EPE) is evaluated at EP1-EP15 of FIG. 4 discussed below.

In an example, the performance metric is EPE, then the second cost function CF2 can be as follows:

$$CF2(s, m) = \sum_{j \in PW, eval} |epe_j|^p$$

In the above equation, s and m refers to source and mask characteristic respectively, and $epe_j$ is an EPE evaluated at each evaluation point (e.g., including points outside the defect ambit 304) and that satisfying a process window condition.

Furthermore, the iteration involves modifying the current characteristic of the source and/or the mask based on the second gradient of the second cost function and the first guide function 308 of the first cost function 306 so that a sum of the second cost function and the first cost function is reduced.

In an embodiment, the modifying the current characteristic of the mask involves, (but not limited to): modifying a shape and size of a design pattern of the design layout; modifying parameters associated with a continuous transmission mask; and/or placing one or more assist features into a portion of the design layout. In an embodiment, the mask may be a continuous transmission mask (CTM) and the characteristics may be related to a curvilinear pattern of the CTM. For example, a level-set method based CTM determination involves modifying of CTM variables such as a level-set threshold value or other modifiable parameters associated with the CTM. In an embodiment, the assist features comprise a sub resolution assist feature, a printable resolution assist feature, or a combination thereof.

Figure 4:
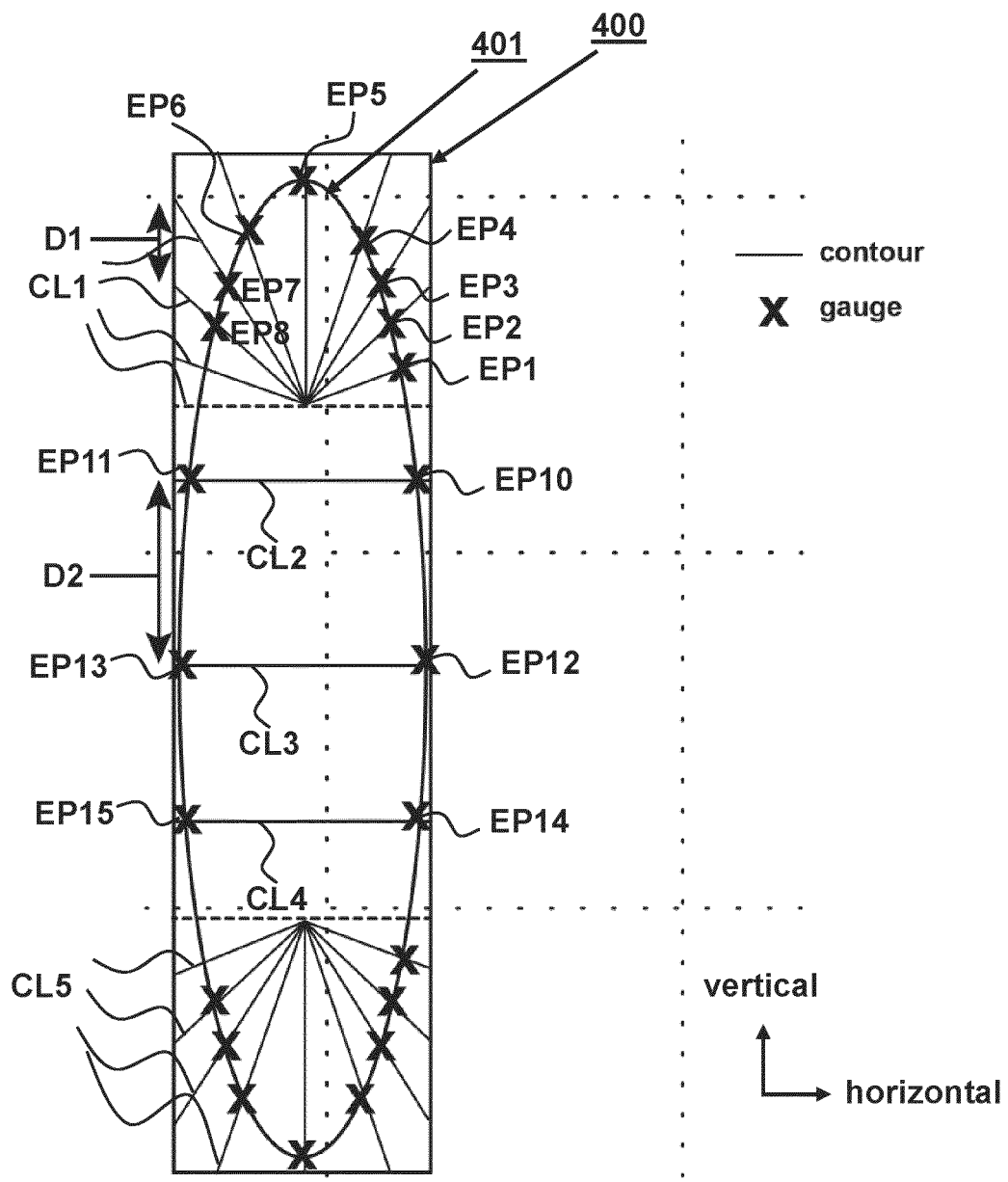
FIG. 4 is an example of determining measurements from a contour of an example printed pattern, according to an embodiment

FIG. 4 illustrates example evaluation locations (or points) along a contour 401 of a simulated pattern or printed pattern on a substrate. Measurements may be made with respect to the evaluation points to determine a characteristic of the pattern (e.g., CD, EPE, etc.). In an embodiment, the measurements can be used to classify a pattern as a defect, determine a performance metric (e.g., EPE, CD), etc. In an embodiment, for measurement purposes, different cut-lines may be defined based on the geometry of the contour and locations where measurements are desired. For example, for curved portions, cut-lines CL1 and CL5 are angular cut-lines originating from respective centers of curved portions of the contour 401. For relatively straight portions, cut-lines CL2, CL3, and CL4 are horizontal cut lines separated vertically along the length of the contour 401. The cut-lines CL1 intersect with the contour 401 at EP1-EP8, which are example gauge points at which measurements may be determined. For example a vertical distance D1 may be determined between cut-lines related to gauge points EP7 and EP8 or using the uniform angle between EP7 and EP8 to place cut-lines, a distance D2 may be determined between gauge points EP11 and EP13, a horizontal dimension (an example of CD) may be measured between EP10 and EP11 (EP12 and EP13, or EP14 and EP15). As mentioned earlier, in an embodiment, the measurements are characteristics of a feature and/or the printed pattern.

In embodiment, an edge placement error (EPE) may be determined as difference between the contour 401 and a desired contour of a desired pattern 400 (e.g., rectangle). In an embodiment, EPEs are determined at each of the evaluation points EP1-E15, then a sum of such EPEs may be computed to determine the second cost function. During optimization, the cost function (e.g., sum of EPEs) is reduced by adjusting the contour 401 at one or more evaluation points (e.g., EP7 and EP8) so that the second cost function is reduced. In an embodiment, such adjustment may be performed by modifying a characteristic of a patterning process e.g., mask pattern, source, dose, etc. Such modification is guided by the second gradient as discussed earlier. Also, the present disclosure provides additional guide, in form of the first gradient (e.g., based on defect ambit 304), to modify the characteristics of the patterning process so that the first cost function 306 (e.g., defect count) is reduced.

Figure 7A:
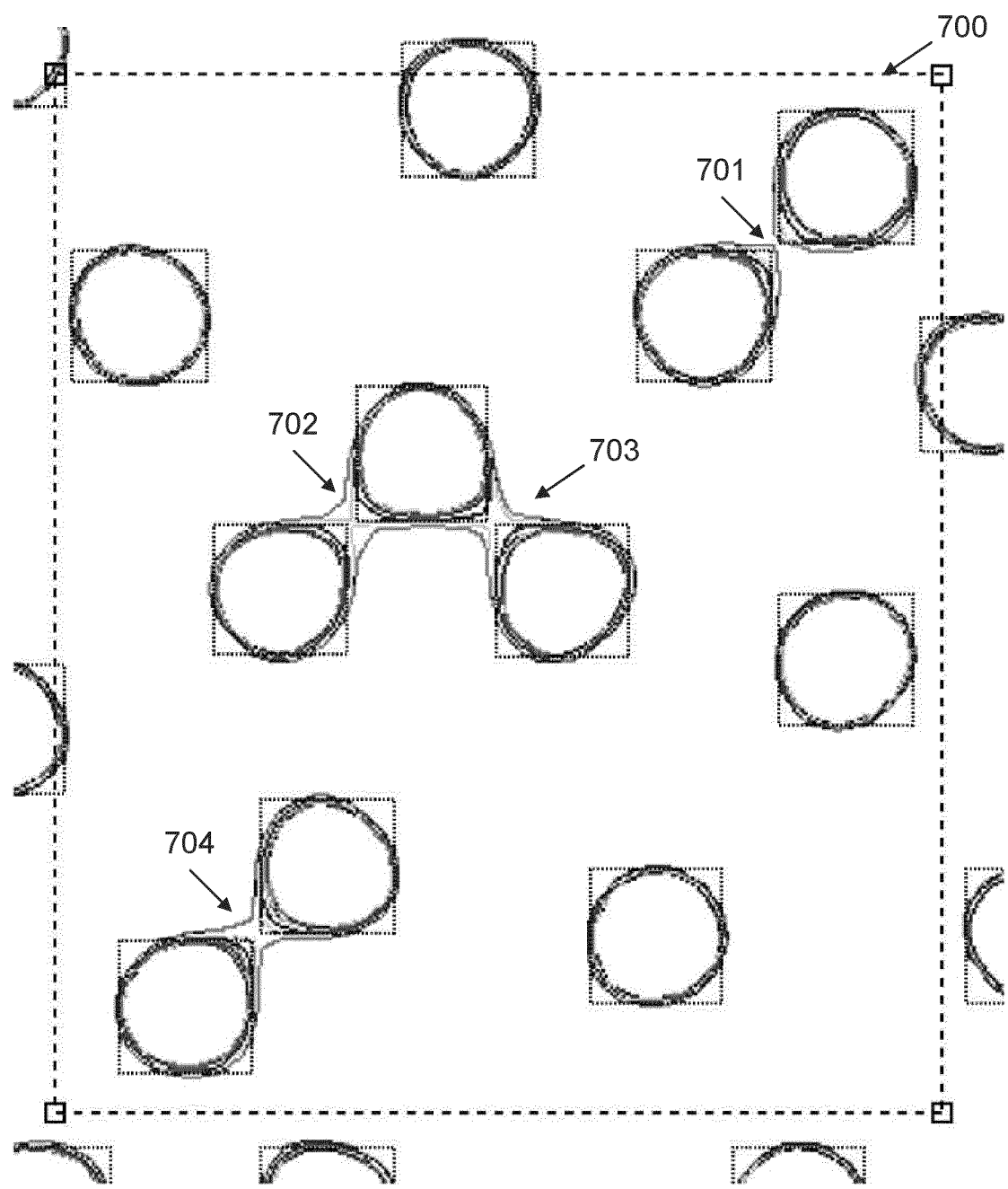
FIG. 7A illustrates an example result of employing an existing OPC process to a design layout, according to an embodiment.

FIG. 7A illustrates an example result of employing an existing OPC process to a design layout 700 comprising contact holes (dotted). In FIG. 7A, the design pattern 700 (dotted) is overlapped with an OPC'ed mask pattern obtained via existing OPC process (e.g., FIGS. 12-15), and further overlapped with a printed pattern on a substrate. When the OPC'ed mask pattern is used via a lithographic apparatus, a bridging defect is printed on the substrate at locations 701-704, as shown.

In an embodiment, the existing optimization process (e.g., SMO) is based on reducing, for example, sum of EPE (e.g., as discussed with respect to FIG. 4) along the contour and do not include particularly focus on reducing defects. As such the characteristic associated with the patterning process are determined to reduce EPE and not necessarily defects. Hence, although the OPC'ed mask pattern (in FIG. 7A) may provide minimum EPE, as determined by the existing OPC process, it may be not minimize number of defects.

Figure 7B:
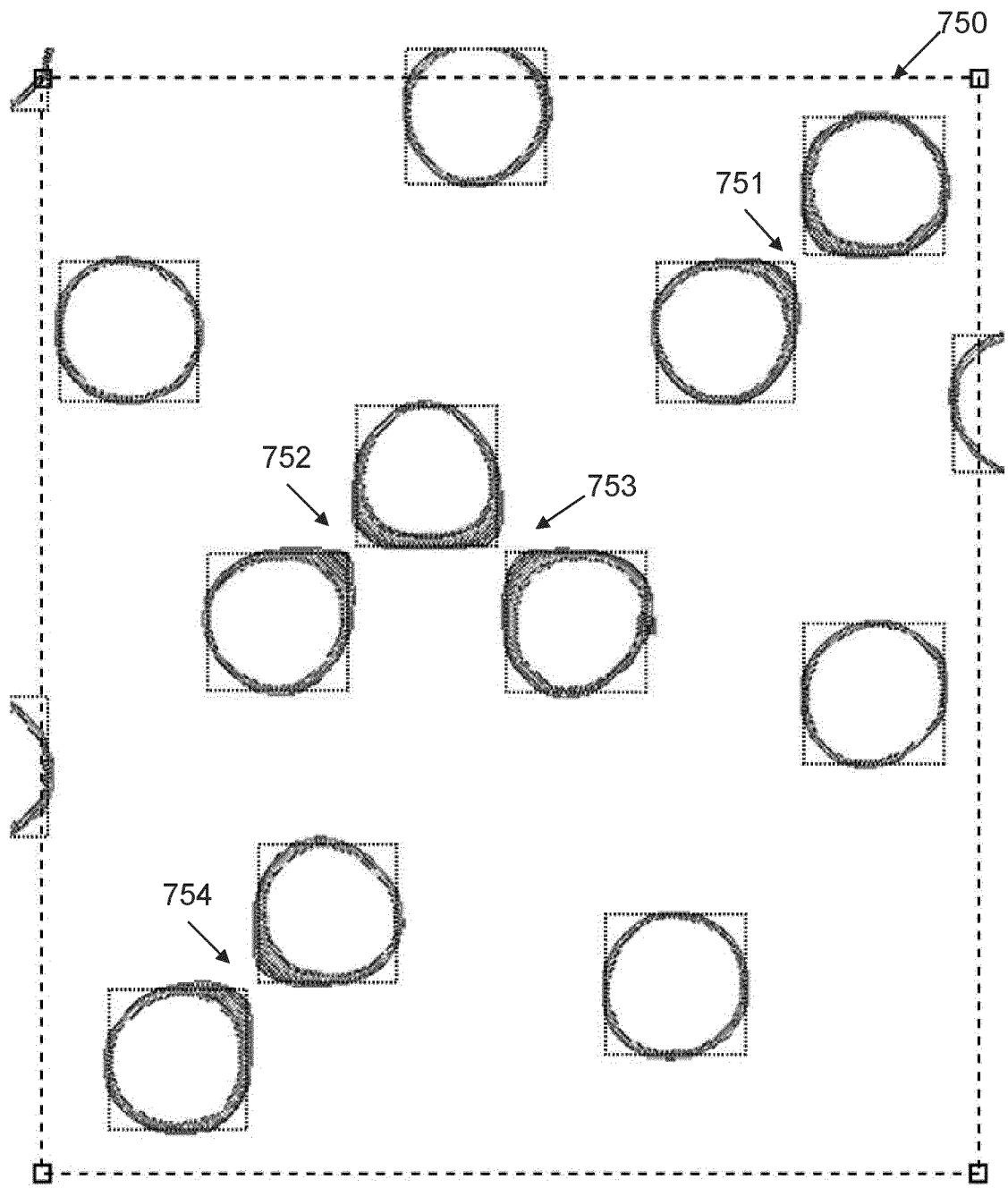
FIG. 7B illustrates an example result of employing an OPC process with the method of FIG. 3, according to an embodiment.

FIG. 7B illustrates an example result of employing a present method 300 to a design layout 750 comprising contact holes (dotted). In FIG. 7B, the design pattern 750 (dotted) is overlapped with an OPC'ed mask pattern obtained via method 300, and further overlapped with a printed pattern on a substrate. The example result shows that upon employing the method 300 (e.g., in SMO), an optimized mask pattern where features at the hotspot locations (e.g., 701-704) are modified to reduce defects. For example, the mask pattern associated with layout 750 is optimized using a first guide function 308 and a first cost function 306 of method 300. Upon modifying the patterns at hotspot locations (e.g., 701-704), the bridging defects are removed. For example, as seen, patterns at 751, 752, 753, and 754 do not have bridging defects.

As mentioned earlier, the use of the first guide function 308 (e.g., pseudo-gradient) is not limited to SMO process. A person skilled in art may determine a characteristic associated with a patterning process using the first guide function 308, as discussed below.

Figure 8:
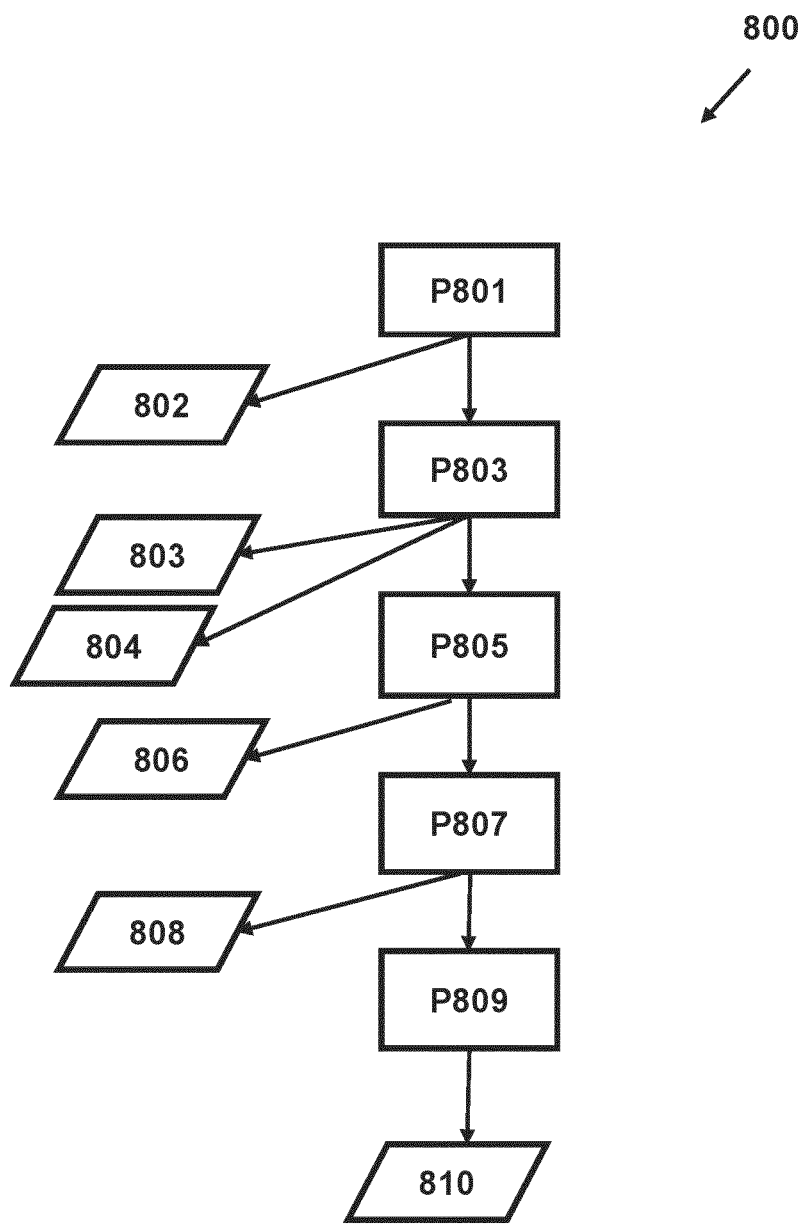
FIG. 8 is a flow chart of a method of determining a characteristic associated with a patterning process, according to an embodiment.

FIG. 8 is a flow chart of a method 800 of determining a characteristic associated with a patterning process to improve, e.g., a performance metric such as a critical dimension of the pattern, or an edge placement error of a pattern to be printed on the substrate.

Procedure P801 (similar to the procedure P301) involves obtaining a hotspot location 802 on a substrate having a relatively high probability of a defect. For example, hotspot locations may be determined using litho manufacturability check (LMC).

Procedure P803 (similar to the procedure P303) involves defining an defect ambit 804 (e.g., 520, 610, 620 in FIGS. 5A, 6A, and 6B, respectively) around the hotspot location 802 to include a portion of a pattern on the substrate and one or more evaluation points associated with the portion of the pattern. In an embodiment, the defect metric is a CD value of a feature of the pattern, and/or a distance between adjacent features. In an embodiment, the distance is a smallest distance between adjacent contours.

In an embodiment, the defect ambit 804 is a boundary around the portion of the pattern with the hotspot location 802 at the center of the boundary. In an embodiment, the defect ambit 804 includes one or more features associated with the hotspot location 802 and the one or more evaluation locations 803 are locations along a contour of the one or more features. In an embodiment, the boundary is a circular boundary, square boundary, or other geometrical shape. In an embodiment, the defect ambit 804 is based on an impact of features within a neighborhood of the hotspot location 802 on the pattern.

Procedure P805 (similar to the procedure P305) involves determining a first cost function 806 (e.g., CF1 discussed above) based on a defect metric associated with the defect. In an embodiment, the first cost function may take any mathematical form defined based upon defects. For example, the first cost function can be a sum of printed defects on a substrate, a sum of potential defects (e.g., hotspots location), a probability value based function associated with a hotspot, or other appropriate mathematical form.

Procedure P807 (similar to the procedure P307) involves determining a first guide function 808 for the first cost function 806, where the pseudo gradient is associated with a performance metric of the patterning process at the one or more evaluation locations 803 within the defect ambit 804. In an embodiment, the determining of the first guide function 808 involves determining a gradient value of the performance metric at the one or more evaluation locations 803 within the defect ambit 804; and assigning a positive value to the first cost function at the one or more evaluation locations 803 within the defect ambit 804.

In an embodiment, the gradient value of the performance metric is evaluated using the performance metric at each of the plurality of evaluation points with respect to the characteristic associated with a patterning process, where the gradient value provides a direction in which the characteristic should be modified so that the first cost function 806 is reduced.

Procedure P809 involves determining the characteristic 810 associated with the patterning process by simulating a process of the patterning process using the first cost function 806, and the first guide function 808, so that the performance metric and the defect metric associated with the patterning process is improved.

In an embodiment, the determining of the characteristic 310 is an iterative process. An iteration involves simulating the patterning process using a design layout to determine a current characteristic of the patterning process, and the performance metric of the patterning process; evaluating a second cost function and a second gradient of the second cost function, where the second cost function is a function of the performance metric. In an embodiment, the evaluating of the second cost function involves computing values of the performance metric at a plurality of evaluation locations of the pattern on the substrate, where an evaluation location is a point on a contour of the pattern at which a value of the performance metric is evaluated.

Furthermore, the iteration involves modifying the current characteristic of the patterning process based on the second gradient of the second cost function and the first guide function 808 of the first cost function 806 so that a sum of the second cost function and the first cost function 806 is reduced.

In an embodiment, the characteristic of the patterning process is at least one of: a mask variable of a mask pattern used in the patterning process, and/or parameters associated with a lithographic apparatus of the patterning process.

In an embodiment, the mask variables comprises at least one of: a shape and size of a feature of the mask pattern, a location of an assist feature, a shape and size of the assist feature, or a variable (e.g., level-set threshold value) associated with a CTM. The aforementioned mask variables are only exemplary and does not limit the scope of the present disclosure.

In an embodiment, the source mask optimization or optimization of any characteristic associated with the patterning process may be performed based on defect detection and employing the first cost function associated with the detected defect. In such optimization, a penalty value associated with the first cost function is added to the second cost function and a gradient (e.g., a second gradient) is computed to determine optimum value of the characteristics of the patterning process. The method is further explained in FIG. 9 below. The method 900 uses source mask optimization as an example and does not limit the scope of the present disclosure to SMO.

Figure 9:
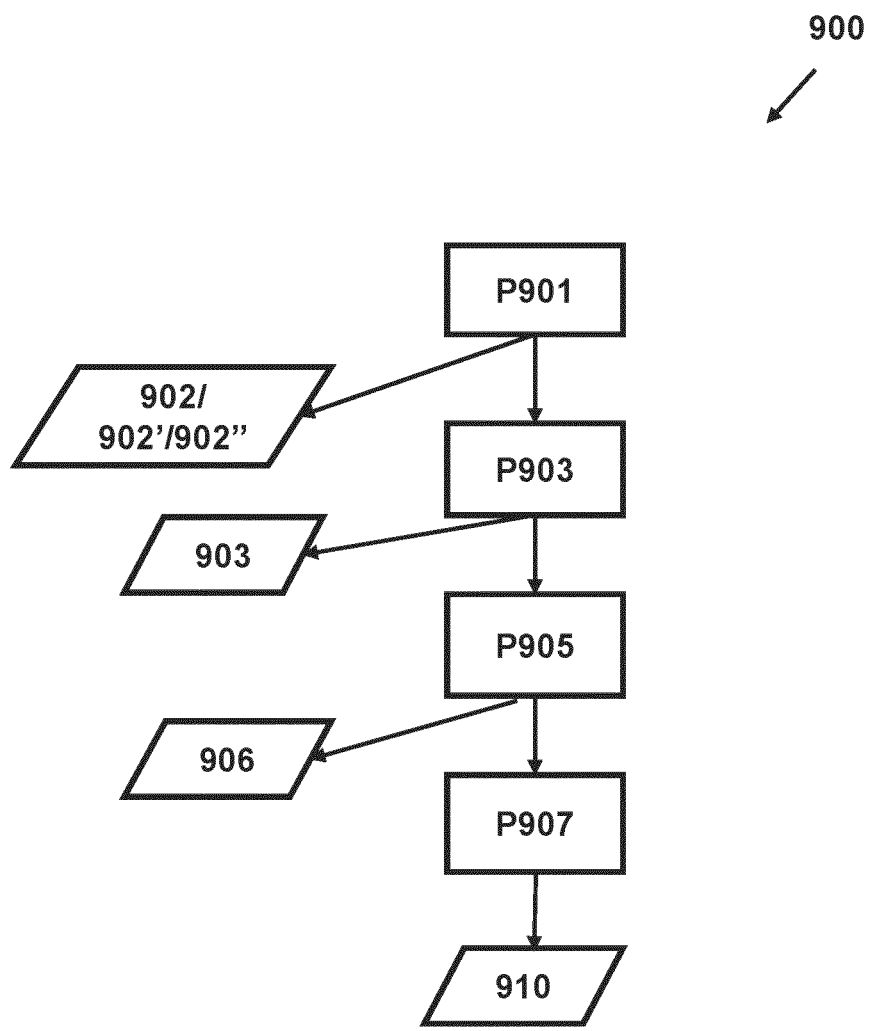
FIG. 9 is a flow chart of a method of source and/or mask optimization of a patterning process based on a defect, according to an embodiment.

FIG. 9 is a flow chart of a method 900 of adjusting a source and/or a mask characteristic associated with a patterning process based on a defect. Furthermore, such adjusting of the source and/or the mask characteristic also improves, e.g., a performance metric such as a critical dimension of the pattern, or an edge placement error of a pattern to be printed on the substrate.

In the method 900, procedure P901 involves obtaining a pattern 902 on a substrate. In an embodiment, the obtaining of the pattern 902 on a substrate involves obtaining, via simulation the patterning process (e.g., in FIG. 2 and FIG. 12-15) using a design layout, a simulated pattern 902' on the substrate. In another embodiment, the pattern 902 may be obtained, via a metrology tool (e.g., inspection tools in FIG. 10-11), an image 902" of a printed pattern on the substrate.

Further, procedure P903 involves determining whether a defect 903 exists in the pattern on the substrate. In an embodiment, the determining of the defect 903 involves executing a lithographic manufacturability rule (also referred as litho manufacturability check (LMC)) on the simulated pattern and/or the image of the printed pattern, wherein the lithographic manufacturability rule comprises a design specification associated with a parameter of the pattern on the substrate; and identifying a portion of the simulated pattern and/or the printed pattern that violates the lithographic manufacturability rule. In an embodiment, an existing LMC-based algorithms of defect detection may be employed to determine existence of a defect in the pattern 902 of the substrate without deviating from the scope of the present disclosure.

Furthermore, procedure P905 involves, responsive to existing of the defect 903, determining a value of a first cost function 906 associated with the defect 903. An example of the cost function (e.g., CF1) was discussed in the method 300 above. For example, the first cost function is defined as zero when there is no defect (or has a very low probability of defect e.g., less than 10%) in the pattern on the substrate and a penalty value when defect exist (or has a very high probability of defect e.g., greater than 70%) in the pattern on the substrate. In an embodiment, the defect may be a bridging defect, a necking defect, or other defects observed in a printed pattern on the substrate. The present disclosure is not limited to a particular defect type.

Once, the first cost function 906 is determined, procedure P907 involves adjusting a source and/or a mask characteristic 910 by executing a source mask optimization process for a design layout using the value of the first cost function 906, and a second cost function (e.g., discussed in FIG. 12-15 below) such that a sum of the first and the second cost functions is reduced.

In an embodiment, the adjusting the source and/or the mask characteristic 910 is an iterative process. An iteration involves executing the source mask optimization process using the design layout to determine a current characteristic of the source and/or the mask, and a performance metric of the patterning process; evaluating a guide function of the sum of the first and the second cost functions, the guide function provides information related to reducing the sum of the cost functions; and modifying the current characteristic of the source and/or the mask based on the second guide function so that the performance metric is improved.

In an embodiment, the evaluating of the sum of the first and the second cost functions involves computing values of the performance metric at a plurality of evaluation locations of the pattern on the substrate, wherein an evaluation location is a point on a contour of the pattern; and adding a penalty value (e.g., w of CF1 discussed in method 300) associated with the defect to the sum of the values of the performance metric.

In an embodiment, the modifying the current characteristic of the mask involves modifying a shape and size of a design pattern of the design layout; and/or placing one or more assist features into a portion of the design layout.

In an embodiment, the assist features comprise a sub resolution assist feature, a printable resolution assist feature, or a combination thereof. In an embodiment, the source mask optimization process comprising a model of the source, a mask model of the design layout, a model of the projection optics, or a combination thereof, wherein the models are configured to simulate an aerial image produced by the source, the portion of the design layout and the projection optics.

In the present disclosure, combination and sub-combinations of disclosed elements constitute separate embodiments. For example, the combination of elements include a defect, a defect ambit associated with the defect, and a first cost function based on the defect ambit used for optimization of a mask. Further, in a sub-combination, the optimization of an assist feature of the mask. In another sub-combination, a source optimization may be performed as well. In yet another combination, defects may be identified and further used to define the first cost function for optimization of a mask and/or source.

Figure 10:
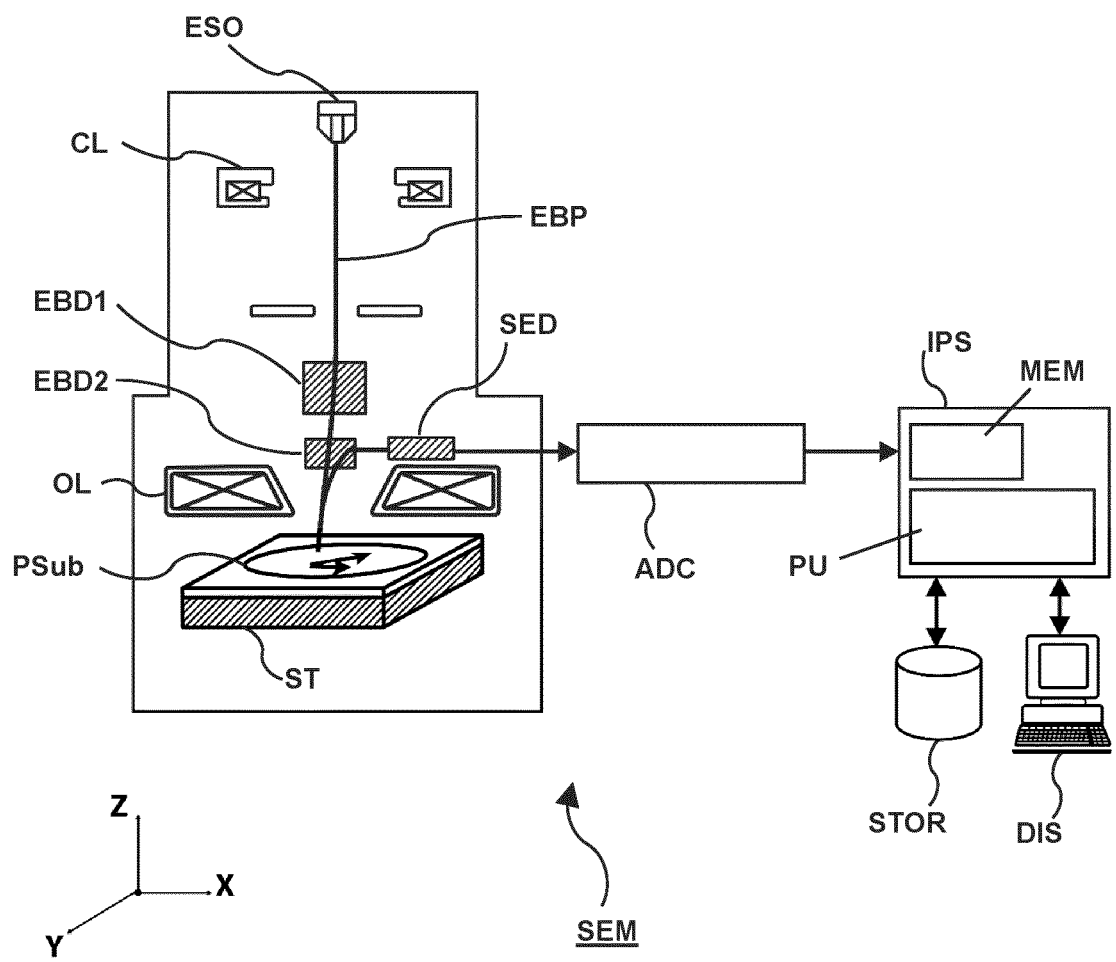
FIG. 10 schematically depicts an embodiment of a scanning electron microscope (SEM), according to an embodiment.

In some embodiments, the inspection apparatus may be a scanning electron microscope (SEM) that yields an image of a structure (e.g., some or all the structure of a device) exposed or transferred on the substrate. FIG. 10 depicts an embodiment of a SEM tool. A primary electron beam EBP emitted from an electron source ESO is converged by condenser lens CL and then passes through a beam deflector EBD1, an ExB deflector EBD2, and an objective lens OL to irradiate a substrate PSub on a substrate table ST at a focus.

When the substrate PSub is irradiated with electron beam EBP, secondary electrons are generated from the substrate PSub. The secondary electrons are deflected by the ExB deflector EBD2 and detected by a secondary electron detector SED. A two-dimensional electron beam image can be obtained by detecting the electrons generated from the sample in synchronization with, e.g., two dimensional scanning of the electron beam by beam deflector EBD1 or with repetitive scanning of electron beam EBP by beam deflector EBD1 in an X or Y direction, together with continuous movement of the substrate PSub by the substrate table ST in the other of the X or Y direction.

A signal detected by secondary electron detector SED is converted to a digital signal by an analog/digital (A/D) converter ADC, and the digital signal is sent to an image processing system IPU. In an embodiment, the image processing system IPU may have memory MEM to store all or part of digital images for processing by a processing unit PU. The processing unit PU (e.g., specially designed hardware or a combination of hardware and software) is configured to convert or process the digital images into datasets representative of the digital images. Further, image processing system IPU may have a storage medium STOR configured to store the digital images and corresponding datasets in a reference database. A display device DIS may be connected with the image processing system IPU, so that an operator can conduct necessary operation of the equipment with the help of a graphical user interface.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In this case, the structure may be referred as a pattern or a desired pattern that comprises a plurality of feature of the semiconductor device. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

Figure 11:
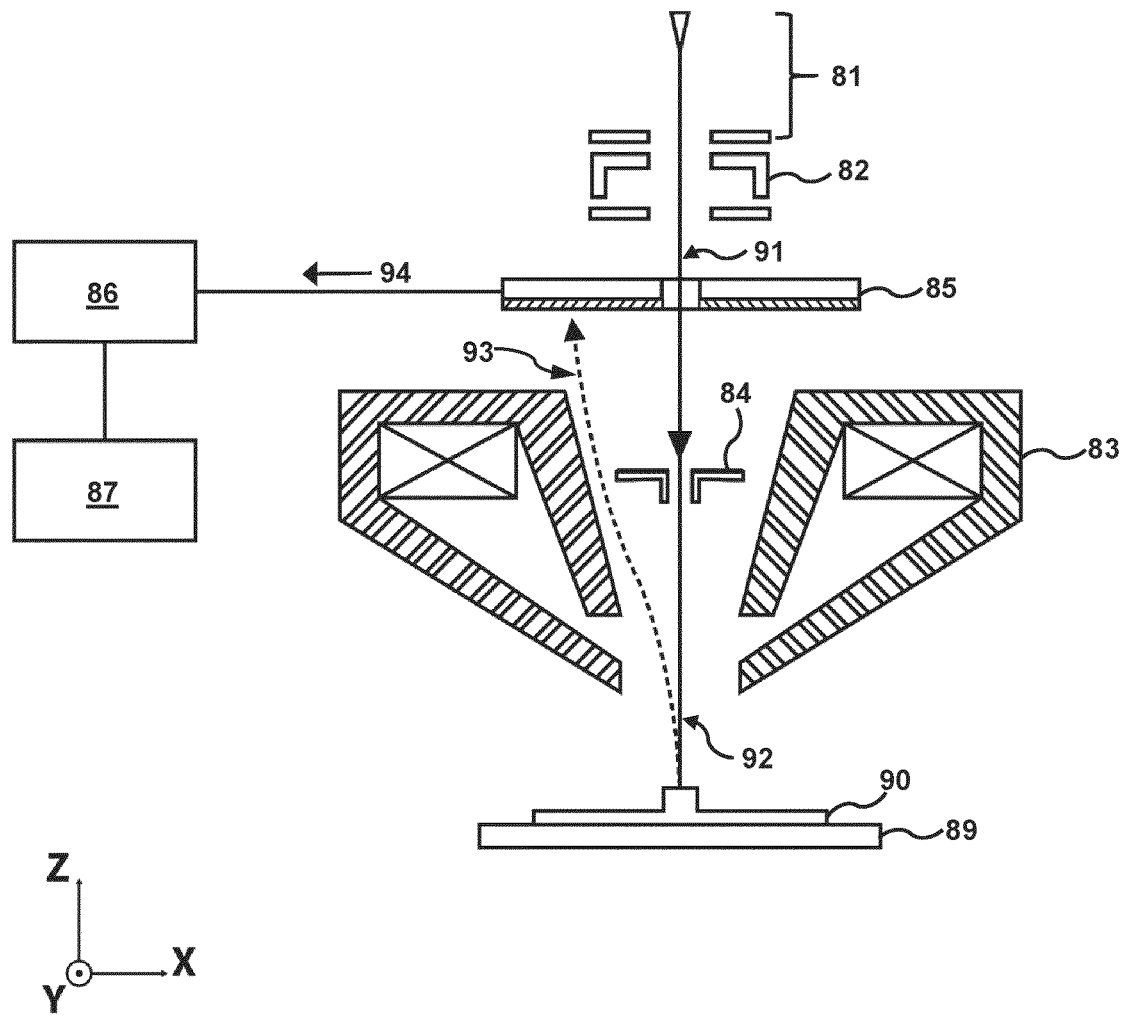
FIG. 11 schematically depicts an embodiment of an electron beam inspection apparatus, according to an embodiment.

FIG. 11 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

In an embodiment, the measurement data (e.g., stochastic variations) related to the printed pattern, determined according to the method of FIG. 3, may be employed in optimization of patterning process or adjusting parameters of the patterning process. As an example, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, especially in the context of lithography simulation/optimization, the term "mask"/"patterning device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the patterning device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or patterning devices (e.g., OPC), the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P} \sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq.1). For example, if considering N PW conditions, then one can categorize the evaluation points according to their PW conditions and write the cost functions as:

$$CF(z_1, z_2, \ldots, z_N) = \quad \text{(Eq. 1')}$$

$$\sum_{p=1}^{P} w_p f_p^2(z_1, z_2, \ldots, z_N) = \sum_{u=1}^{U} \sum_{p_u=1}^{P_u} w_{p_u} f_{p_u}^2(z_1, z_2, \ldots, z)$$

Where $f_{p_u}(z_1, z_2, \ldots, z_N)$ is the value of $f_p(z_1, z_2, \ldots, z_N)$ under the u-th PW condition $u=1, \ldots, U$. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by yield or a desired throughput of the lithographic projection apparatus. The desired yield or throughput may limit the dose and thus has implications for the stochastic effects (e.g., imposing a lower bound on the stochastic effects). Higher throughput generally leads to lower dose, shorter longer exposure time and greater stochastic effects. Higher yield generally leads to a restricted design which may be sensitive to stochastic risk. Consideration of substrate throughput, yield and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \operatorname*{argmin}_{(z_1, z_2, \ldots, z_N) \in Z} CF(z_1, z_2, z_N) = \operatorname*{argmin}_{(z_1, z_2, \ldots, z_N) \in Z} \sum_{p=1}^{P} w_p f_p^2(z_1, z_2, \ldots, z_N) \quad \text{(Eq. 2)}$$

Figure 12:
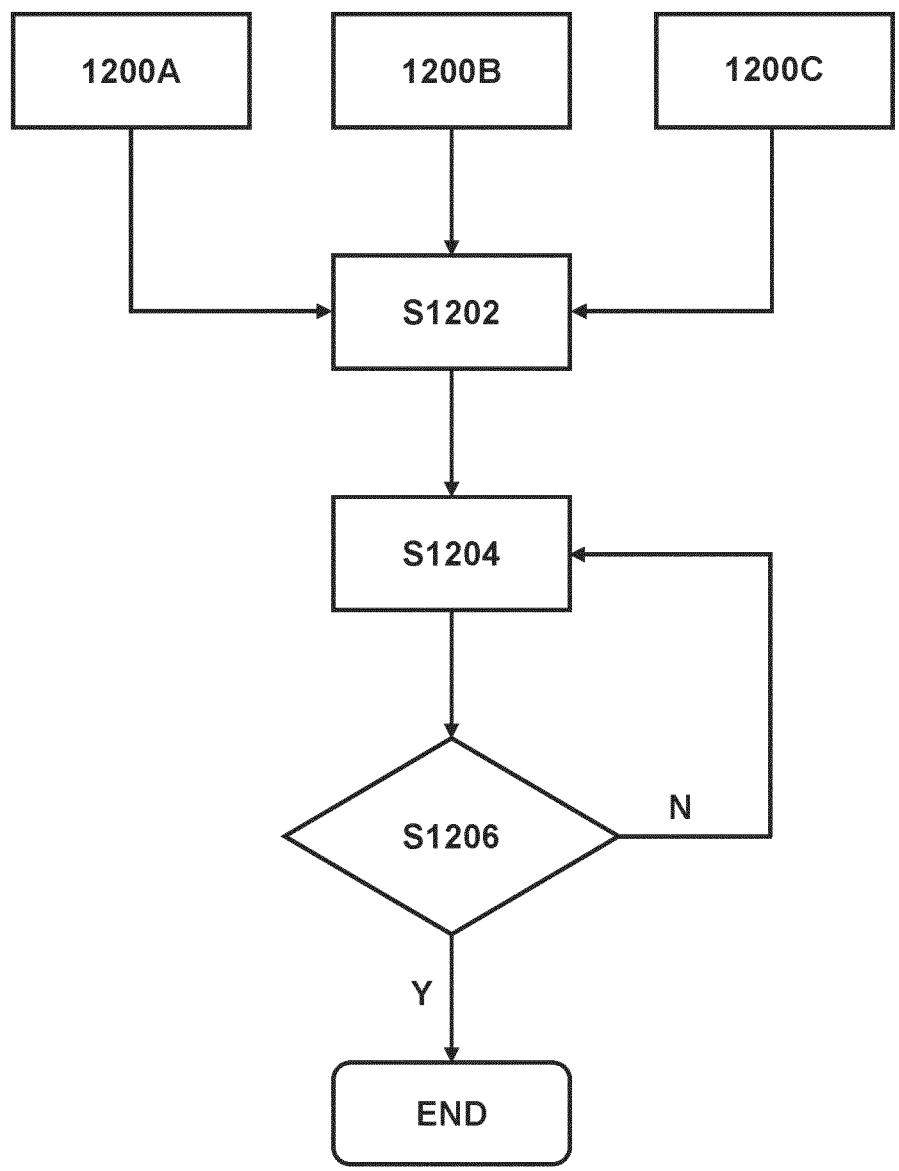
FIG. 12 is a flow diagram illustrating aspects of an example methodology of joint optimization, according to an embodiment.

A general method of optimizing the lithography projection apparatus, according to an embodiment, is illustrated in FIG. 12. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 13:
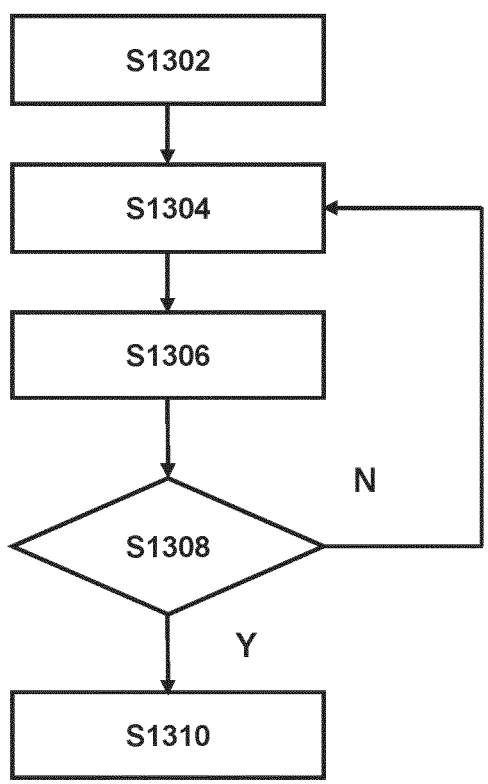
FIG. 13 shows an embodiment of another optimization method, according to an embodiment.

In FIG. 13, the optimization of all the design variables is executed simultaneously. Such flow may be called the simultaneous flow or co-optimization flow. Alternatively, the optimization of all the design variables is executed alternatively, as illustrated in FIG. 13. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 13, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hotspots' and/or 'warm spots' are identified, then an MO is performed. In view of the present disclosure numerous permutations and combinations of sub-optimizations are possible in order to achieve the desired optimization results.

Figure 14A:
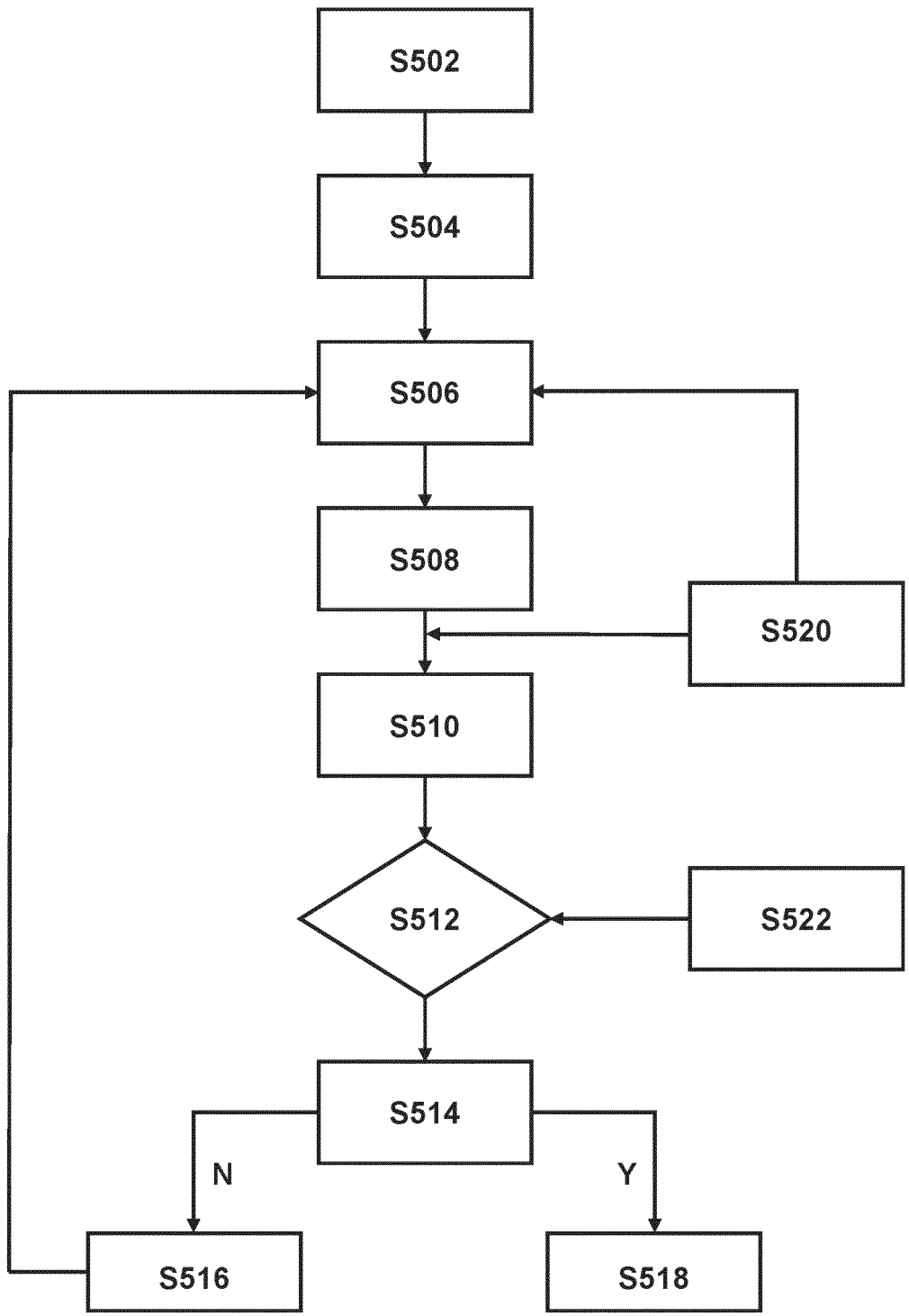
FIGS. 14A, 14B and 15 show example flowcharts of various optimization processes, according to an embodiment.

FIG. 14A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables are updated with the result of the i-th iteration, and the process goes back to step S506. The process of FIG. 14A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n}, (n = 1, 2, \ldots N)$$

exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. CF $(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$ $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $z_{1(i+1)}, z_{2(i+1)}, \ldots, z_{N(i+1)}$ can be derived by solving by N linear equations:

$$\frac{\partial CF(z_1, z_2, \ldots, z_N)}{\partial z_n} = 0,$$

wherein n=1, 2, ... N.

If the design variables $(z_1, z_2, \ldots, z_N)$ are under the constraints in the form of J inequalities (e.g. tuning ranges of $(z_1, z_2, \ldots, z_N)$)

$$\sum_{n=1}^{N} A_{nj} z_n \leq B_j, \text{ for } j = 1, 2, \ldots J;$$

and K equalities (e.g. interdependence between the design variables)

$$\sum_{n=1}^{N} C_{nk} z_n = D_k, \text{ for } k = 1, 2, \ldots K;$$

the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p}, \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q, \quad \text{(Eq. 6)}$$

wherein q is an even positive integer such as at least 4, preferably at least 10. Eq 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for p=1, ... P, $$\sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} z_n \leq \quad \text{(Eq. 6')}$$

$$E_{Up} + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} z_{ni} -$$

$$f_p(z_{1i}, z_{2i}, \ldots, z_{Ni})$$

and $$-\sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} z_n \leq \quad \text{(Eq. 6'')}$$

$$-E_{Up} - \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} z_{ni} +$$

$$f_p(z_{1i}, z_{2i}, \ldots, z_{Ni})$$

Since Eq. 3 is generally valid only in the vicinity of $(z_{1i}, z_{2i}, \ldots, z_{Ni})$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = \quad \text{(Eq. 6''')}$$

$$(1 - \lambda) \sum_{p=1}^{P} w_p f_p^2(z_1, z_2, \ldots, z_N) + \lambda \max_{1 \leq p \leq P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq.4 and the RMS of the defect size is only minimized; while if $\lambda=1$, then this becomes Eq.5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition $(f_0, \varepsilon_0)$ in the process window, wherein $f_0$ is a nominal focus and $\varepsilon_0$ is a nominal dose, minimizing one of the cost functions below in the vicinity $(f_0 \pm \Delta f, \varepsilon_0 \pm \Delta \varepsilon)$:

$$CF(z_1, z_2, \ldots, z_N, f_0, \varepsilon_0) = \quad \text{(Eq. 7)}$$

$$\max_{(f,\varepsilon)=(f_0 \pm \Delta f, \varepsilon_0 \pm \Delta \varepsilon)} \max_{p} |f_p(z_1, z_2, \ldots, z_N, f, \varepsilon)|.$$

or $$CF(z_1, z_2, \ldots, z_N, f_0, \varepsilon_0) = \quad \text{(Eq. 7')}$$

$$\sum_{(f,\varepsilon)=(f_0 \pm \Delta f, \varepsilon_0 \pm \Delta \varepsilon)} \sum_{p} w_p f_p^2(z_1, z_2, \ldots, z_N, f, \varepsilon)$$

or $$CF(z_1, z_2, \ldots, z_N, f_0, \varepsilon_0) = \quad \text{(Eq.7'')}$$

$$(1 - \lambda) \sum_{(f,\varepsilon)=(f_0 \pm \Delta f, \varepsilon_0 \pm \Delta \varepsilon)} \sum_{p} w_p f_p^2(z_1, z_2, \ldots, z_N, f, \varepsilon) +$$

$$\lambda \max_{(f,\varepsilon)=(f_0 \pm \Delta f, \varepsilon_0 \pm \Delta \varepsilon)} \max_{p} |f_p(z_1, z_2, \ldots, z_N, f, \varepsilon)|$$

If the nominal focus $f_0$ and nominal dose $\varepsilon_0$ are allowed to shift, they can be optimized jointly with the design variables $(z_1, z_2, \ldots, z_N)$. In the next step, $(f_0 \pm \Delta f, \varepsilon_0 \pm \Delta \varepsilon)$ is accepted as part of the process window, if a set of values of $(z_1, z_2, \ldots, z_N, f, \varepsilon)$ can be found such that the cost function is within a preset limit.

Alternatively, if the focus and dose are not allowed to shift, the design variables $(z_1, z_2, \ldots, z_N)$ are optimized with the focus and dose fixed at the nominal focus $f_0$ and nominal dose $\varepsilon_0$. In an alternative embodiment, $(f_0 \pm \Delta f, \varepsilon_0 \pm \Delta \varepsilon)$ is accepted as part of the process window, if a set of values of $(z_1, z_2, \ldots, z_N)$ can be found such that the cost function is within a preset limit.

The methods described earlier in this disclosure can be used to minimize the respective cost functions of Eqs. 7, 7', or 7". If the design variables are characteristics of the projection optics, such as the Zernike coefficients, then minimizing the cost functions of Eqs. 7, 7', or 7" leads to process window maximization based on projection optics optimization, i.e., LO. If the design variables are characteristics of the source and patterning device in addition to those of the projection optics, then minimizing the cost function of Eqs. 7, 7', or 7" leads to process window maximizing based on SMLO, as illustrated in FIG. 13. If the design variables are characteristics of the source and patterning device and, then minimizing the cost functions of Eqs. 7, 7', or 7" leads to process window maximization based on SMO. The cost functions of Eqs. 7, 7', or 7" can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 15:
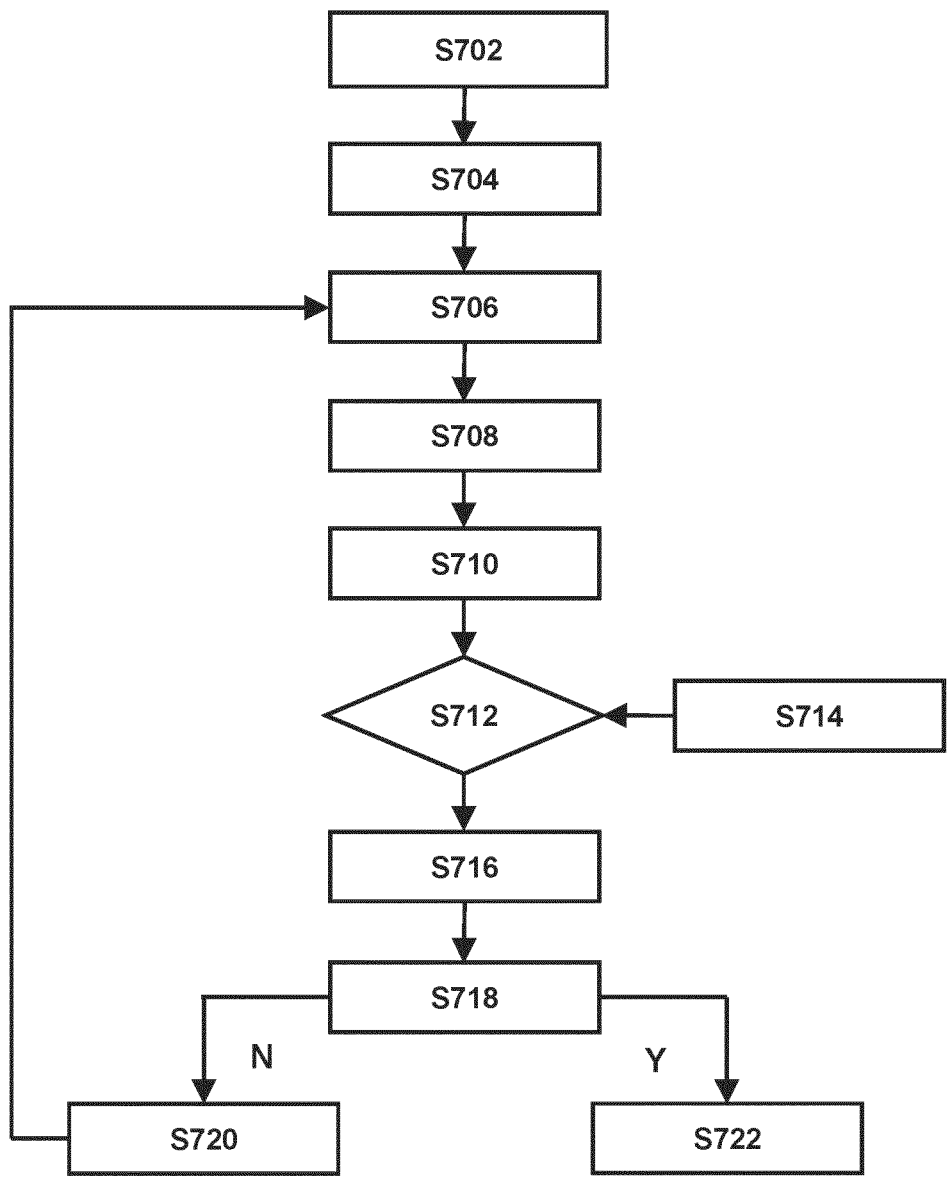

FIG. 15 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 14A. As mentioned before, the final output may be a wavefront aberration map in the pupil plane, optimized to produce the desired imaging performance. The final output may also be an optimized source map and/or an optimized design layout.

Figure 14B:
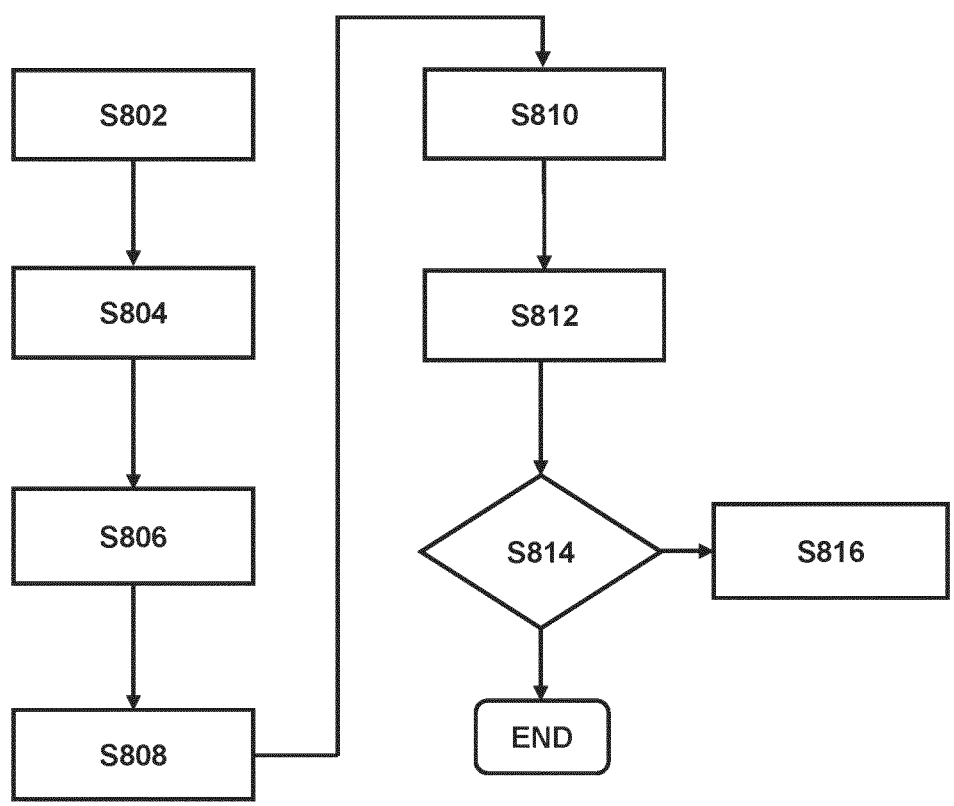

FIG. 14B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, $\sigma_{sepe}$ or LWR or local CD variation of 2D features. In one embodiment, the stochastic effects include stochastic variations of characteristics of a resist image. For example, such stochastic variations may include failure rate of a feature, $\sigma_{sepe}$, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 16:
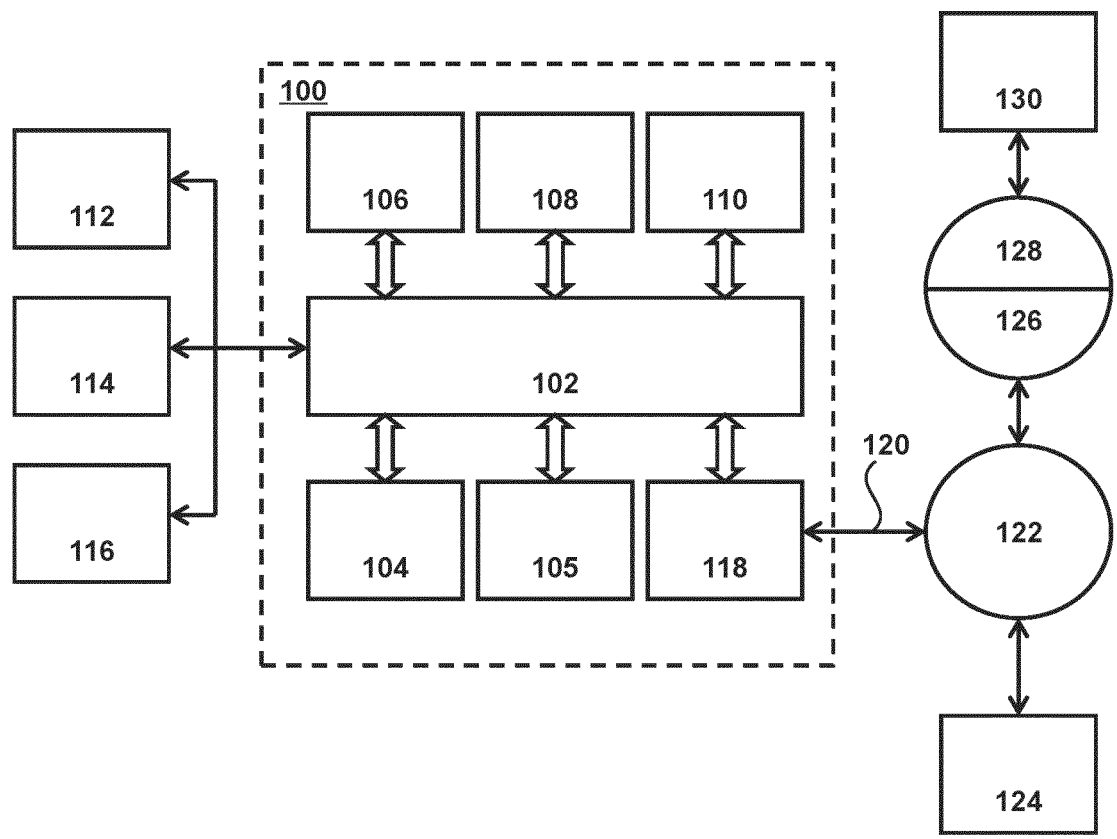
FIG. 16 is a block diagram of an example computer system, according to an embodiment.

FIG. 16 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 17:
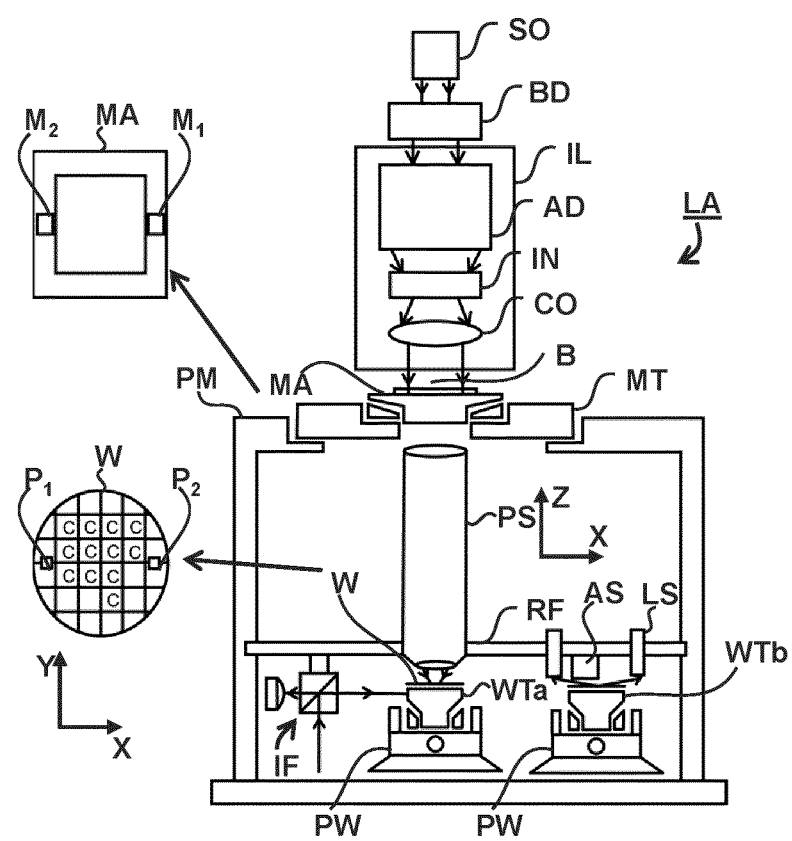
FIG. 17 is a schematic diagram of a lithographic projection apparatus, according to an embodiment.

FIG. 17 schematically depicts an exemplary lithographic projection apparatus LA whose illumination source could be optimized utilizing the methods described herein. The apparatus LA comprises:

- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 17 that the source SO may be within the housing of the lithographic projection apparatus LA (as is often the case when the source SO is a mercury lamp, for example), but that it may also be remote from the lithographic projection apparatus LA, the radiation beam that it produces being led into the apparatus LA (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 17. However, in the case of a wafer stepper (as opposed to a step-and-scan tool) the patterning device table MT may just be connected to a short stroke actuator, or may be fixed.

The depicted tool can be used in two different modes:

- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 18:
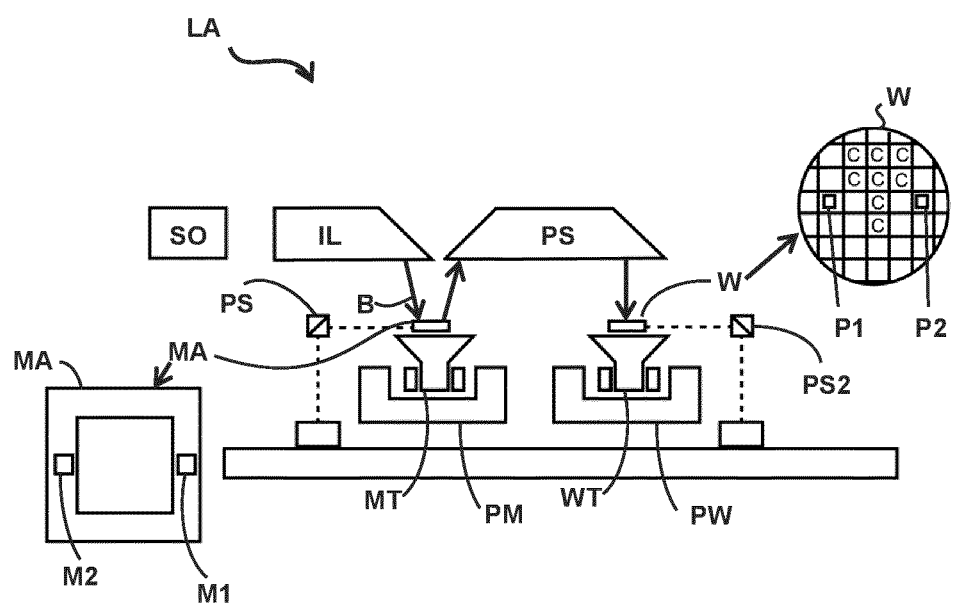
FIG. 18 is a schematic diagram of another lithographic projection apparatus, according to an embodiment.

FIG. 18 schematically depicts another exemplary lithographic projection apparatus LA whose illumination source could be optimized utilizing the methods described herein.

The lithographic projection apparatus LA includes:

- a source collector module SO
- an illumination system (illuminator) IL configured to condition a radiation beam B (e.g. EUV radiation).
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 18, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 18, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 19:
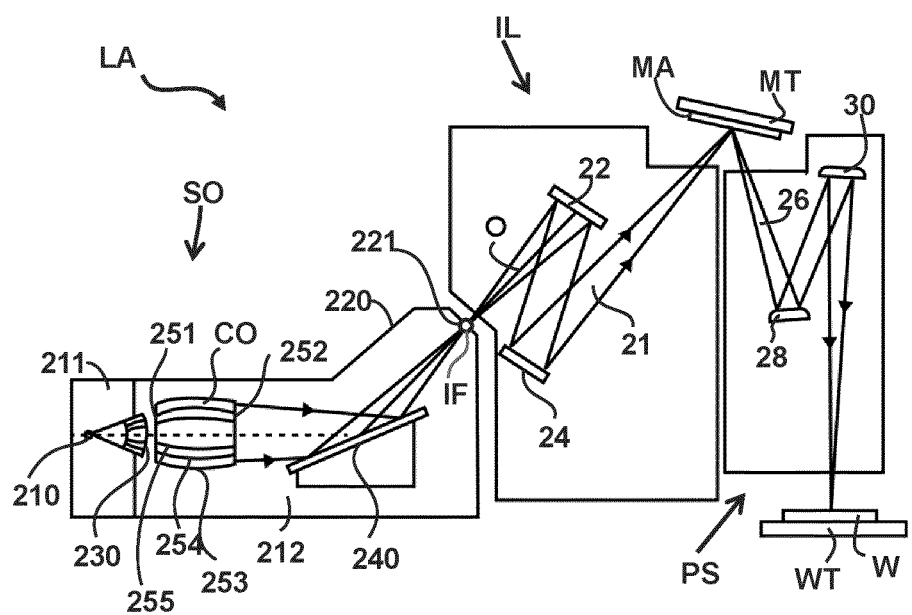
FIG. 19 is a more detailed view of the apparatus in FIG. 18, according to an embodiment.

FIG. 19 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 19.

Collector optic CO, as illustrated in FIG. 19, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 20:
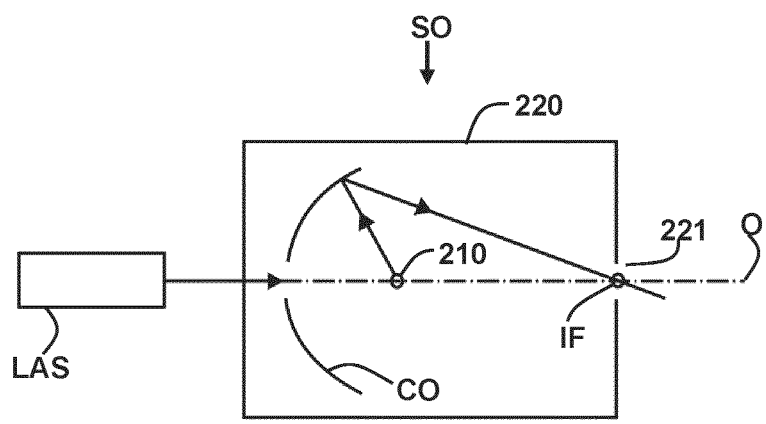
FIG. 20 is a more detailed view of the source collector module SO of the apparatus of FIGS. 18 and 19, according to an embodiment.

Alternatively, the source collector module SO may be part of an LPP radiation system as shown in FIG. 20. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Embodiments of the present disclosure can be further described by the following clauses.

1. A method of source and mask optimization of a patterning process, the method comprising:
   obtaining a location on a substrate having a threshold probability of having a defect;
   defining an defect ambit around the location to include a portion of a pattern on the substrate and one or more evaluation points associated with the portion of the pattern;
   determining a value of a first cost function based on a defect metric associated with the defect;
   determining a first guide function for the first cost function, wherein the first guide function is associated with a performance metric of the patterning process at the one or more evaluation locations within the defect ambit; and
   adjusting a source and/or a mask characteristic by executing a source mask optimization process for a design layout using the value of the first cost function, and the first guide function.

2. The method of clause 1, wherein the determining of the first guide function comprises:
   determining a value of the first guide function using the performance metric at the one or more evaluation locations within the defect ambit.

3. The method of clause 2, wherein the value of the first guide function evaluated using the performance metric at each of the plurality of evaluation points with respect to the characteristic of the source and/or the mask to be optimized, wherein the value provides a direction in which the characteristic should be modified so that the first cost function is reduced.

4. The method of any of clauses 1-3, wherein the adjusting the source and/or the mask characteristic is an iterative process, an iteration comprises:
   executing the source mask optimization process using the design layout to determine a current characteristic of the source and/or the mask, and the performance metric of the patterning process;
   evaluating a second cost function and a second guide function of the second cost function, wherein the second cost function is a function of the performance metric; and
   modifying the current characteristic of the source and/or the mask based on the second guide function of the second cost function and the first guide function of the first cost function so that a sum of the second cost function and the first cost function is reduced.

5. The method of clause 4, wherein the evaluating of the second cost function comprises:
   computing values of the performance metric at a plurality of evaluation locations of the pattern on the substrate, wherein an evaluation location is a point on a contour of the pattern.

6. The method of clause 4, wherein the modifying the current characteristic of the mask comprises:
   modifying a shape and size of a design pattern of the design layout;
   modifying parameters associated with a continuous transmission mask; and/or
   placing one or more assist features into a portion of the design layout.

7. The method of clause 6, wherein the assist features comprise a sub resolution assist feature, a printable resolution assist feature, or a combination thereof.

8. The method of any of clauses 1-7, wherein the source mask optimization process comprising a model of the source, a mask model of the design layout, a model of the projection optics, or a combination thereof, wherein the models are configured to simulate an aerial image produced by the source, the portion of the design layout and the projection optics.

9. The method of clause 8, wherein the optimizing of the source and/or the mask of the patterning process comprises executing at least one of the models.

10. The method of clause 9, wherein the optimizing the source comprises optimizing an illumination shape and/or an illumination intensity.

11. The method of any of clauses 1-10, wherein the first cost function is a sum of a number of hotspots and a number of defects printed on the substrate.

12. The method of any of clauses 1-11, wherein the first cost function is defined as zero outside when a defect does not exist and a penalty value when a defect exist.

13. The method of any of clauses 1-12, wherein the defect is at least one of: a bridging defect, or a necking defect.

14. The method of any of clauses 1-13, wherein the defect ambit is a boundary around the portion of the pattern with the location at the center of the boundary.

15. The method of any of clauses 1-14, wherein the defect ambit includes one or more features associated with the location and the one or more evaluation locations are locations along a contour of the one or more features.

16. The method of any of clauses 14-15, wherein the boundary is a circular boundary, square boundary, or other geometrical shape.

17. The method of any of clauses 1-16, wherein the defect ambit is based on an impact of features within a neighborhood of the location on the pattern.

18. The method of any of clauses 1-17, wherein the location is associated one or more features of the pattern having critical dimension within a defect tolerance.

19. The method of any of clauses 1-18, wherein the performance metric is at least one of: a critical dimension of the pattern, or an edge placement error of the pattern.

20. A method of determining a characteristic associated with a patterning process, the method comprising:
    obtaining a location on a substrate having a threshold probability of having a defect;
    defining a defect ambit around the location to include a portion of a pattern on the substrate and one or more evaluation points associated with the portion of the pattern;
    determining a first cost function based on a defect metric associated with the defect;
    determining a first guide function for the first cost function, wherein the first guide function is associated with a performance metric of the patterning process at the one or more evaluation locations within the defect ambit; and
    determining the characteristic associated with the patterning process by simulating a process of the patterning process using the first cost function, and the first guide function.

21. The method of clause 20, wherein the determining of the first guide function comprises:
    determining a value of the first guide function using the performance metric at the one or more evaluation locations within the defect ambit.

22. The method of clause 21, wherein the value of the first guide function is evaluated using the performance metric at each of the plurality of evaluation points with respect to the characteristic associated with a patterning process, wherein the value provides a direction in which the characteristic should be modified so that the first cost function is reduced.

23. The method of any of clauses 20-22, wherein the determining of the characteristic is an iterative process comprising:
    simulating the patterning process using a design layout to determine a current characteristic of the patterning process, and the performance metric of the patterning process;
    evaluating a second cost function and a second guide function of the second cost function, wherein the second cost function is a function of the performance metric; and
    modifying the current characteristic of the patterning process based on the second guide function of the second cost function and the first guide function of the first cost function so that a sum of the second cost function and the first cost function is reduced.

24. The method of clause 23, wherein the evaluating of the second cost function comprises:
    computing values of the performance metric at a plurality of evaluation locations of the pattern on the substrate, wherein an evaluation location is a point on a contour of the pattern.

25. The method of any of clauses 20-24, wherein the defect metric is a CD value of a feature of the pattern, and/or a distance between adjacent features.

26. The method of any of clauses 20-22, wherein the distance is a smallest distance between adjacent contours.

27. The method of any of clauses 20-26, wherein the defect ambit is a boundary around the portion of the pattern with the location at the center of the boundary.

28. The method of any of clauses 20-27, wherein the defect ambit includes one or more features associated with the location and the one or more evaluation locations are locations along a contour of the one or more features.

29. The method of any of clauses 27-28, wherein the boundary is a circular boundary, square boundary, or other geometrical shape.

30. The method of any of clauses 20-29, wherein the defect ambit is based on an impact of features within a neighborhood of the location on the pattern.

31. The method of any of clauses 20-30, wherein the characteristic of the patterning process is at least one of: a mask variable of a mask pattern used in the patterning process, and/or parameters associated with a lithographic apparatus of the patterning process.

32. The method of clauses 31, wherein the mask variables comprises at least one of: a shape and size of a feature of the mask pattern, a location of an assist feature, a shape and size of the assist feature, or a variable associated with a continuous transmission mask.

33. The method of any of clauses 20-32, wherein evaluation locations are points along a contour at which a value of the performance metric is evaluated.

34. The method of any of clauses 20-33, wherein the performance metric is at least one of: a critical dimension of the pattern, or an edge placement error of the pattern.

35. A method of source and/or mask optimization of a patterning process, the method comprising:
    obtaining a pattern on a substrate;
    determining whether a defect exists in the pattern on the substrate;
    responsive to existing of the defect, determining a value of a first cost function associated with the defect; and
    adjusting a source and/or a mask characteristic by executing a source mask optimization process for a design layout using the value of the first cost function, and a second cost function such that a sum of the first and the second cost functions is reduced.

36. The method of clause 35, wherein the obtaining of the pattern on a substrate comprises:
    obtaining, via simulation the patterning process using a design layout, a simulated pattern on the substrate; and/or
    obtaining, via a metrology tool, an image of a printed pattern on the substrate.

37. The method of clause 36, wherein the determining of the defect comprises:
    executing a lithographic manufacturability rule on the simulated pattern and/or the image of the printed pattern, wherein the lithographic manufacturability rule comprises a design specification associated with a parameter of the pattern on the substrate; and
    identifying a portion of the simulated pattern and/or the printed pattern that violates the lithographic manufacturability rule.

38. The method of any of clauses 35-37, wherein the adjusting the source and/or the mask characteristic is an iterative process, an iteration comprises:

executing the source mask optimization process using the design layout to determine a current characteristic of the source and/or the mask, and a performance metric of the patterning process;

evaluating a guide function of the sum of the first and the second cost functions, the guide function provides information related to reducing the sum of the cost functions; and modifying the current characteristic of the source and/or the mask based on the second guide function so that the performance metric is improved.

39. The method of clause 38, wherein the evaluating of the sum of the first and the second cost functions comprises:

computing values of the performance metric at a plurality of evaluation locations of the pattern on the substrate, wherein an evaluation location is a point on a contour of the pattern; and adding a cost value associated with the defect to the sum of the values of the performance metric.

40. The method of clause 39, wherein the modifying the current characteristic of the mask comprises:

modifying a shape and size of a design pattern of the design layout;

modifying parameters associated with a continuous transmission mask; and/or placing one or more assist features into a portion of the design layout.

41. The method of clause 40, wherein the assist features comprise a sub resolution assist feature, a printable resolution assist feature, or a combination thereof.

42. The method of any of clauses 35-41, wherein the source mask optimization process comprising a model of the source, a mask model of the design layout, a model of the projection optics, or a combination thereof, wherein the models are configured to simulate an aerial image produced by the source, the portion of the design layout and the projection optics.

43. The method of any of clauses 35-42, wherein the first cost function is defined as zero outside when no defect in the pattern on the substrate and a penalty value when defect exist in the pattern on the substrate.

44. The method of any of clauses 35-43, wherein the defect is at least one of: a bridging defect, or a necking defect.

45. A computer program product comprising a non-transitory computer readable medium having instructions recorded thereon, the instructions when executed by a computer implementing the method of any of the above clauses.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method of determining a characteristic associated with a patterning process, the method comprising:

obtaining a location on a substrate that has a probability of having a defect equal to or above a threshold probability;

defining a defect ambit around the location to include a portion of a pattern on the substrate and one or more evaluation points associated with the portion of the pattern;

determining a first cost function based on a defect metric associated with the defect;

determining a first guide function for the fust cost function, wherein the first guide function is associated with a performance metric of the patterning process at the one or more evaluation locations within the defect ambit; and determining the characteristic associated with the patterning process by simulating a process of the patterning process using the first cost function and the first guide function.

2. The method of claim 1, wherein the determining of the first guide function comprises determining a value of the first guide function using the performance metric at the one or more evaluation locations within the defect ambit.

3. The method of claim 1, wherein the determining of the characteristic comprises:

simulating the patterning process using a design layout to determine a current characteristic of the patterning process, and the performance metric of the patterning process;

evaluating a second cost function and a second guide function of the second cost function, wherein the second cost function is a function of the performance metric; and modifying the current characteristic of the patterning process based on the second guide function of the second cost function and the first guide function of the first cost function so that a sum of the second cost function and the first cost function is reduced.

4. The method of claim 1, wherein the defect metric is a CD value of a feature of the pattern, and/or a distance between adjacent features.

5. The method of claim 1, wherein the defect ambit is a boundary around the portion of the pattern with the location at the center of the boundary.

6. The method of claim 1, wherein the defect ambit includes one or more features associated with the location and the one or more evaluation locations are locations along a contour of the one or more features.

7. A computer product comprising a non-transitory computer readable medium having instructions therein, the instructions, when executed by a computer system, configured to cause the computer system to at least:

obtain a location on a substrate that has a probability of having a defect equal to or above a threshold probability;

define a defect ambit around the location to include a portion of a pattern on the substrate and one or more evaluation points associated with the portion of the pattern;

determine a first cost function based on a defect metric associated with the defect;

determine a first guide function for the first cost function, wherein the first guide function is associated with a performance metric of a patterning process at the one or more evaluation locations within the defect ambit; and determine a characteristic associated with the patterning process by simulation of a process of the patterning process using the first cost function and the first guide function.

8. The computer product of claim 7, wherein the instructions are further configured to cause the computer system to determine a value of the first guide function using the performance metric at the one or more evaluation locations within the defect ambit.

9. The computer product of claim 8, wherein the instructions configured to cause the computer system to determine the value of the first guide function are further configured to cause the computer system to evaluate the value of the first guide function using the performance metric at each of the plurality of evaluation points with respect to the characteristic associated with the patterning process, wherein the value provides a direction in which the characteristic should be modified so that the first cost function is reduced.

10. The computer product of claim 7, wherein the instructions configured to cause the computer system to determine the characteristic are configured to cause the computer system to:
- simulate the patterning process using a design layout to determine a current characteristic of the patterning process, and the performance metric of the patterning process;
- evaluate a second cost function and a second guide function of the second cost function, wherein the second cost function is a function of the performance metric; and
- modify the current characteristic of the patterning process based on the second guide function of the second cost function and the first guide function of the first cost function so that a sum of the second cost function and the first cost function is reduced.

11. The computer product of claim 10, wherein the instructions configured to cause the computer system to evaluate the second cost function are configured to cause the computer system to compute values of the performance metric at a plurality of evaluation locations of the pattern on the substrate, wherein an evaluation location is a point on a contour of the pattern.

12. The computer product of claim 7, wherein the defect metric is a CD value of a feature of the pattern, and/or a distance between adjacent features.

13. The computer product of claim 7, wherein defect metric is a distance between adjacent features and the distance is a smallest distance between adjacent contours.

14. The computer product of claim 7, wherein the defect ambit is a boundary around the portion of the pattern with the location at the center of the boundary.

15. The computer product of claim 7, wherein the defect ambit includes one or more features associated with the location and the one or more evaluation locations are locations along a contour of the one or more features.

16. The computer product of claim 7, wherein the defect ambit is based on an impact of features within a neighborhood of the location on the pattern.

17. The computer product of claim 7, wherein the characteristic of the patterning process is a mask variable of a mask pattern used in the patterning process and/or a parameter associated with a lithographic apparatus of the patterning process.

18. The computer product of claim 17, wherein the characteristic of the patterning process is a mask variable of a mask pattern used in the patterning process and the mask variable comprises at least one selected from: a shape and/or size of a feature of the mask pattern, a location of an assist feature, a shape and/or size of an assist feature, or a variable associated with a continuous transmission mask.

19. The computer product of claim 7, wherein evaluation locations are points along a contour at which a value of the performance metric is evaluated.

20. The computer product of claim 7, wherein the performance metric is a critical dimension of the pattern and/or an edge placement error of the pattern.

* * * * *

UNITED STATES PATENT AND TRADEMARK OFFICE
CERTIFICATE OF CORRECTION

| | | |
|---|---|---|
| PATENT NO. | : 12,092,963 B2 | Page 1 of 1 |
| APPLICATION NO. | : 17/605358 | |
| DATED | : September 17, 2024 | |
| INVENTOR(S) | : Xingyue Peng et al. | |

It is certified that error appears in the above-identified patent and that said Letters Patent is hereby corrected as shown below:

On the Title Page

Item (60) Related Application Data:
Please include -- Provisional application No. 62/838,423, filed on April 25, 2019 --.

Signed and Sealed this
Twenty-second Day of October, 2024

Katherine Kelly Vidal
*Director of the United States Patent and Trademark Office*